(12) United States Patent
Kato et al.

(10) Patent No.: US 9,579,804 B2
(45) Date of Patent: Feb. 28, 2017

(54) TRANSFER ROBOT

(75) Inventors: Isao Kato, Kobe (JP); Shigeki Ono, Kobe (JP)

(73) Assignee: KAWASAKI JUKOGYO KABUSHIKI KAISHA, Kobe-shi (JP)

(*) Notice: Subject to any disclaimer, the term of this patent is extended or adjusted under 35 U.S.C. 154(b) by 350 days.

(21) Appl. No.: 13/822,848

(22) PCT Filed: Nov. 30, 2011

(86) PCT No.: PCT/JP2011/077674
§ 371 (c)(1),
(2), (4) Date: Mar. 13, 2013

(87) PCT Pub. No.: WO2012/074007
PCT Pub. Date: Jun. 7, 2012

(65) Prior Publication Data
US 2013/0170935 A1    Jul. 4, 2013

(30) Foreign Application Priority Data
Nov. 30, 2010   (JP) ................................ 2010-266950

(51) Int. Cl.
*B25J 18/04*    (2006.01)
*B25J 9/04*     (2006.01)
(Continued)

(52) U.S. Cl.
CPC ............... *B25J 18/04* (2013.01); *B25J 9/042* (2013.01); *B25J 9/044* (2013.01); *B65G 49/067* (2013.01);
(Continued)

(58) Field of Classification Search
CPC ..... B25J 9/04; B25J 9/041; B25J 9/042; B25J 9/046; B25J 9/047; B25J 9/1055;
(Continued)

(56) References Cited

U.S. PATENT DOCUMENTS 5,540,541 A    7/1996   Gosdowski et al.
5,989,346 A *  11/1999  Hiroki ..................... 118/719

FOREIGN PATENT DOCUMENTS

JP    A-1-180768      7/1989
JP    H05-503254 A    6/1993
(Continued)

OTHER PUBLICATIONS

Feb. 14, 2012 International Search Report issued in International Application No. PCT/JP2011/077674.
(Continued)

*Primary Examiner* — Michael McCullough
*Assistant Examiner* — Brendan Tighe
(74) *Attorney, Agent, or Firm* — Oliff PLC

(57) ABSTRACT

Described herein is a conveyance robot. In certain aspects, a conveyance robot can include a first link member configured to be rotatable about a first axis, a second link member configured to be rotatable about a second axis positioned at a predetermined distance relative to the first axis, a holding member configured to be capable of holding an article and rotating about a third axis positioned at a predetermined distance relative to the second axis, an ascending and descending drive unit for driving at least the holding member to ascend and descend. In certain aspects, an arm link mechanism can be included. The arm link mechanism can be constituted by connecting the first link member, the second link member, and the holding member in this order, and the ascending and descending drive unit is placed between the first link member and the holding member so as to form a part of the arm link mechanism.

5 Claims, 17 Drawing Sheets

(51) Int. Cl.
  *B65G 49/06* (2006.01)
  *H01L 21/677* (2006.01)
(52) U.S. Cl.
  CPC .. *H01L 21/67742* (2013.01); *H01L 21/67766* (2013.01); *B65G 2249/02* (2013.01)
(58) Field of Classification Search
  CPC ..... B25J 9/12; B25J 9/123; B25J 9/126; B25J 9/14; B25J 9/142; B25J 9/144; B25J 9/146; B25J 11/0095; B25J 15/0014; B25J 17/025; B25J 17/0258; B25J 18/02; B25J 18/025; B25J 18/04; H01L 21/677; H01L 21/67703; H01L 21/67721; H01L 21/67739; H01L 21/67742; H01L 21/67766; H01L 2221/67; H01L 2221/683; Y10S 901/16; Y10S 901/17; Y10S 901/23
  USPC .............. 74/490.02, 490.03, 490.05, 490.06; 414/226.5, 744.3, 744.5, 744.7, 806, 918, 414/935, 941; 901/16, 17, 23
  See application file for complete search history.

(56) References Cited

FOREIGN PATENT DOCUMENTS

| | | |
|---|---|---|
| JP | A-5-277970 | 10/1993 |
| JP | A-6-126664 | 5/1994 |
| JP | A-11-222121 | 8/1999 |
| JP | A-2000-42951 | 2/2000 |
| JP | A-2001-274218 | 10/2001 |
| JP | 2003-285284 A | 10/2003 |
| JP | 2010-142904 A | 7/2010 |
| WO | WO 2008/007516 A1 | 1/2008 |

OTHER PUBLICATIONS

Jun. 4, 2013 International Preliminary Report on Patentability issued in International Patent Application No. PCT/JP2011/077674.
Mar. 24, 2015 Office Action issued in Japanese Patent Application No. 2010-266950.

\* cited by examiner

TRANSFER ROBOT

TECHNICAL FIELD

The present invention relates to a conveyance robot which conveys articles, particularly suitable for conveying a heavy substrate, such as a large sized glass substrate for a solar panel.

BACKGROUND ART

In order to carry in a substrate to be processed and carry out a processed substrate for a substrate processing device, such as a chemical vapor deposition device (CVD device), various sorts of conveyance robots are used.

As an example of a substrate to be processed, there is a rectangular glass substrate which is used for a solar panel whose size exceeds 2 m on one side, and is considered to be a large sized heavy article.

When storing such a large sized glass substrate in a rack in a horizontal state, its middle part bents downward due to gravity. Therefore, in order to store a multiple number of glass substrates in a rack, it is necessary to secure enough vertical space in order to prevent glass substrates from contacting each other.

As a result, a height of the rack becomes higher, and in order for a conveyance robot to cope with the height, it is necessary to secure enough vertical movement distance with respect to an ascending and descending movement of a substrate holding member in order to hold the substrate.

Conventionally, in order to secure enough movement distance for the ascending and descending movement of the substrate holding member, a conveyance robot provided with an ascending and descending drive unit for driving the substrate holding member to ascend or descend is known. With respect to such the ascending and descending drive unit, it is known that there is a unit for making a rotating main shaft, which is equipped with a proximal end portion of a robot arm, ascend and descend (Patent Literature 1). Moreover, it is known that there is a device provided with a pillar shaped member that extends vertically and the ascending and descending member that can ascend or descend along with the pillar shaped member, and the ascending and descending member is equipped with the substrate holding member (Patent Literatures 2, 3).

RELATED ART LITERATURE

Patent Literatures

Patent Literature 1: Japanese Patent Application Laid-Open No. 5-277970
Patent Literature 2: Japanese Patent Application Laid-Open No. 2001-274218
Patent Literature 3: WO2008/007516 A1

SUMMARY OF INVENTION

Technical Problem

However, the above mentioned conventional conveyance robot is configured so as to drive the robot arm, which is formed with a first link member, a second link member, and the substrate holding member (refer to a horizontally multiple joints arm), to ascend or descend as a whole, and subsequently this causes a problem that a vast amount of driving power is needed for driving the robot arm to ascend or descend (Patent Literatures 1, 2, and 3).

Specially, in order to convey heavy articles, such as the large sized glass substrate, it is necessary to configure the robot arm with members having enough rigidity, and the weight of the arm inevitably becomes large so that the ascending and descending driving power needed for the ascending and descending drive unit increasingly becomes larger.

Moreover, in the conventional technique, a mechanism to move the ascending and descending drive unit of the robot arm in the horizontal plane is disposed independently from a link mechanism consisting of the first link member, the second link member and the substrate holding member (Patent Literatures 2, 3).

Thus, this causes the following problems. The number of members needed to configure the conveyance robot increases, and a structure of the conveyance robot becomes more complicated, and furthermore an exclusive area (space) occupied by the conveyance robot is enlarged.

The present invention has been made taking into account the above mentioned situation, and its objective is to provide a conveyance robot that can reduce the ascending and descending driving power needed for the ascending and descending drive unit.

Moreover, another objective of the present invention is to provide a conveyance robot which can realize a mechanism to move the ascending and descending drive unit in the horizontal plane, while minimizing the complication of the structure of the robot.

Solution to Problem

In order to solve the problem, a conveyance robot according to the present invention includes: a first link member configured so as to be capable of rotating about a first axis; a second link member configured so as to be capable of rotating about a second axis which is positioned at a predetermined distance relative to the first axis; a holding member configured so as to be capable of rotating about a third axis which is positioned at a predetermined distance relative to the second axis and of holding an article; and an ascending and descending drive unit which drives at least the holding member to ascend and descend; wherein an arm link mechanism is constituted by connecting the first link member, the second link member, and the holding member in this order, and the ascending and descending drive unit is placed between the first link member and the holding member so as to form a part of the arm link mechanism.

Moreover, it is preferred that the ascending and descending drive unit is used for connecting the second link member and the holding member.

Moreover, it is preferred that the ascending and descending drive unit has a pillar shaped member that is fixed on the second link member, and an ascending and descending member that is disposed to the pillar shaped member so as to be able to ascend and descend, and the holding member is disposed on the ascending and descending member so as to be rotatable about the third axis.

Moreover, it is preferred that the ascending and descending drive unit has a pillar shaped member that is disposed on the second link member so as to be rotatable about the third axis, an ascending and descending member that is disposed to the pillar shaped member so as to be able to ascend and descend, and the holding member is fixed on the ascending and descending member.

Moreover, it is preferred that the ascending and descending drive unit is used for connecting the first link member and the second link member.

Moreover, it is preferred that the ascending and descending drive unit has a pillar shaped member that is fixed on the first link member, and an ascending and descending member that is disposed to the pillar shaped member so as to be able to ascend and descend, the second link member is disposed on the ascending and descending member so as to be rotatable about the second axis, and the holding member is disposed on the second link member so as to be rotatable about the third axis.

Moreover, it is preferred that the ascending and descending drive unit has a pillar shaped member that is disposed on the first link member so as to be rotatable about the second axis, and an ascending and descending member that is disposed to the pillar shaped member so as to be able to ascend and descend, and the second link member is fixed on the ascending and descending member.

Moreover, it is preferred that the predetermined distance between the first axis and the second axis is equal to the predetermined distance between the second axis and the third axis.

Moreover, it is preferred that at a most retracted position on a movement control range, each size of the holding member, the first link member, the second link member, and the ascending and descending drive unit, and a direction of the ascending and descending drive unit are selected so as for an area including the holding member holding an article, the article held by the holding member, the first link member, the second link member, and the ascending and descending drive unit to be placed within a turning area where a radius is rotated fully about the first axis with a definition of the radius taken from a distance from the first axis to a most distant point of the article or of the holding member.

Advantageous Effects of Invention

According to the conveyance robot of the present invention, since the arm link mechanism is constituted by connecting the first link member, the second link member, and the holding member in this order, and the ascending and descending drive unit is placed between the first link member and the holding member so as to constitute a part of the arm link mechanism, at least the first link member can be omitted from objects which are to be made ascend and descend by the ascending and descending drive unit, thus it enables to reduce the ascending and descending drive power needed for the ascending and descending drive unit.

Moreover, since the movement of the ascending and descending drive unit in the horizontal plane can be performed by rotation movement of the first link member and/or the second link member constituting the robot arm, the horizontal movement of the ascending and descending drive unit can be realized while minimizing the complication of the structure of the robot.

DESCRIPTION OF EMBODIMENTS

A conveyance robot according to an embodiment of the present invention will be described hereunder with reference to the drawings. Note that, the below mentioned conveyance robot is suitable for conveying a large sized glass substrate and is provided with a single arm.

Firstly, referring to FIG. 1 to FIG. 4, the conveyance robot according to the embodiment of the present invention will be described.

Figure 1:
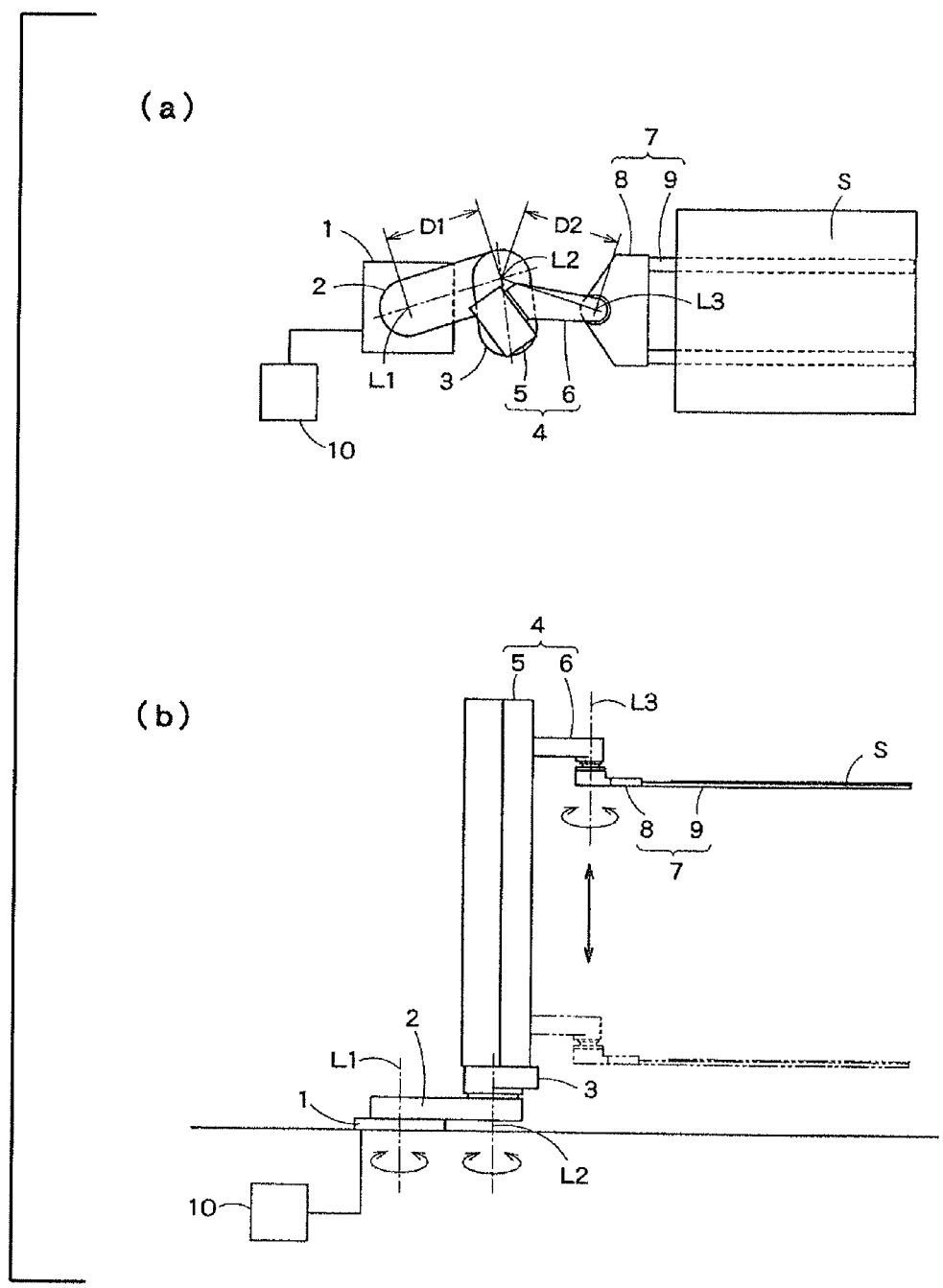
FIG. 1 is a diagram illustrating a conveyance robot according to an embodiment of the present invention, (a) is a plan view, and (b) is a side view.

FIG. 1 illustrates the conveyance robot according to the embodiment that has a base 1. The proximal end portion of a first link member 2 is connected to the base 1 so as to be rotatable about a first axis L1. The proximal end portion of a second link member 3 is connected to the distal end portion of the first link member 2 so as to be rotatable about a second axis L2 which is positioned at a predetermined distance D1 relative to the first axis L1.

An ascending and descending drive unit 4 is disposed on the second link member 3, and this ascending and descending drive unit 4 comprises a vertically extending pillar shaped member 5, and an ascending and descending member 6 which is disposed so as to be movable upward or downward along the pillar shaped member 5. The pillar shaped member 5 of the ascending and descending drive unit 4 has a form of a hollow member with an open front surface, and its horizontal cross section is formed into a rectangular shape. A lower end portion of the pillar shaped member 5 is fixed on a part of the second link member 3 which is closer to the distal end side relative to the second axis L2.

The ascending and descending member 6 of the ascending and descending drive unit 4 has an elongated shape that extends horizontally, and this ascending and descending member 6 itself forms a part of the substantial horizontal length of the robot arm. As illustrated in FIG. 1 (a), the ascending and descending member 6 is formed so as to diagonally protrude from the front surface of the pillar shaped member 5.

A proximal end portion 8 of a substrate holding member 7 is connected to the lower surface of the distal end portion of the ascending and descending member 6 so as to be rotatable about a third axis L3. The third axis L3 is positioned at a predetermined distance D2 relative to the second axis L2, and the distance D2 is equal to the distance D1.

A multiple number of finger parts 9 (in this example, 2 finger parts are shown) extend horizontally from the proximal end portion 8 of the substrate holding member 7, and a substrate S made of glass is held on the finger parts 9. Finger parts 9 are provided with a unit for adsorbing the substrate S (not shown) to hold the same.

Rotating axes L1, L2, L3 are parallel to one another and extend in Z axis direction (vertical direction), and the substrate holding member 7 is driven to be displaced with a certain degree of freedom in the X, Y, and Z axis directions.

As mentioned above, in this embodiment, the ascending and descending drive unit 4 is positioned between the second link member 3 and the substrate holding member 7, and constitutes a part of an arm link mechanism.

Figure 2:
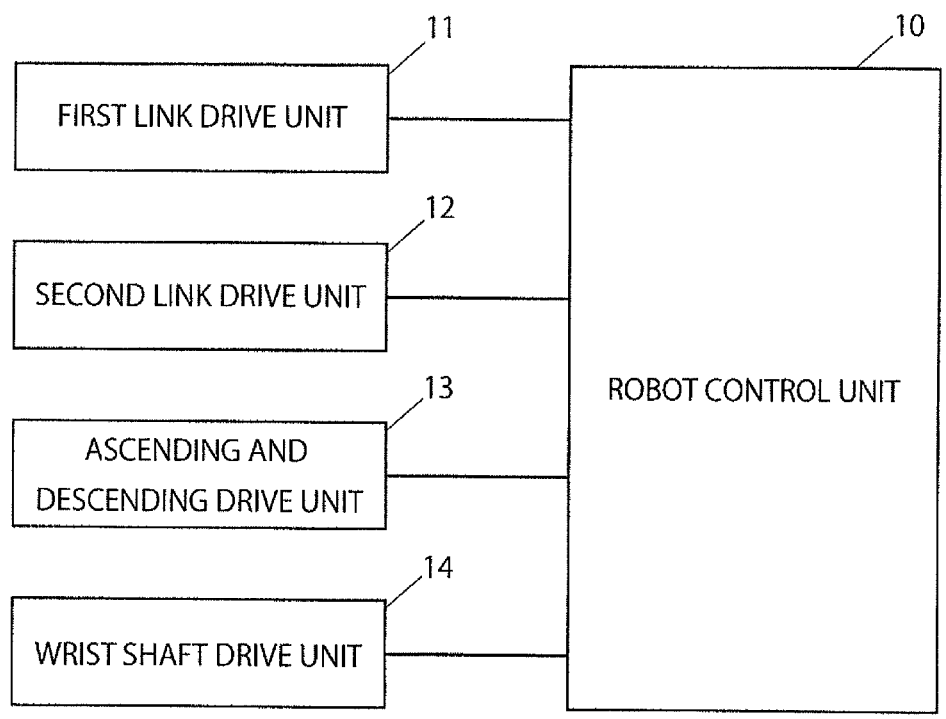
FIG. 2 is a schematic diagram of a constitution of the conveyance robot illustrated in FIG. 1.

As illustrated in FIG. 1 and FIG. 2, the conveyance robot according to this embodiment is provided with a robot control unit 10, and this robot control unit 10 controls driving of a first link drive unit 11, a second link drive unit 12, the ascending and descending drive unit 4, and a wrist axis drive unit 13.

Figure 3:
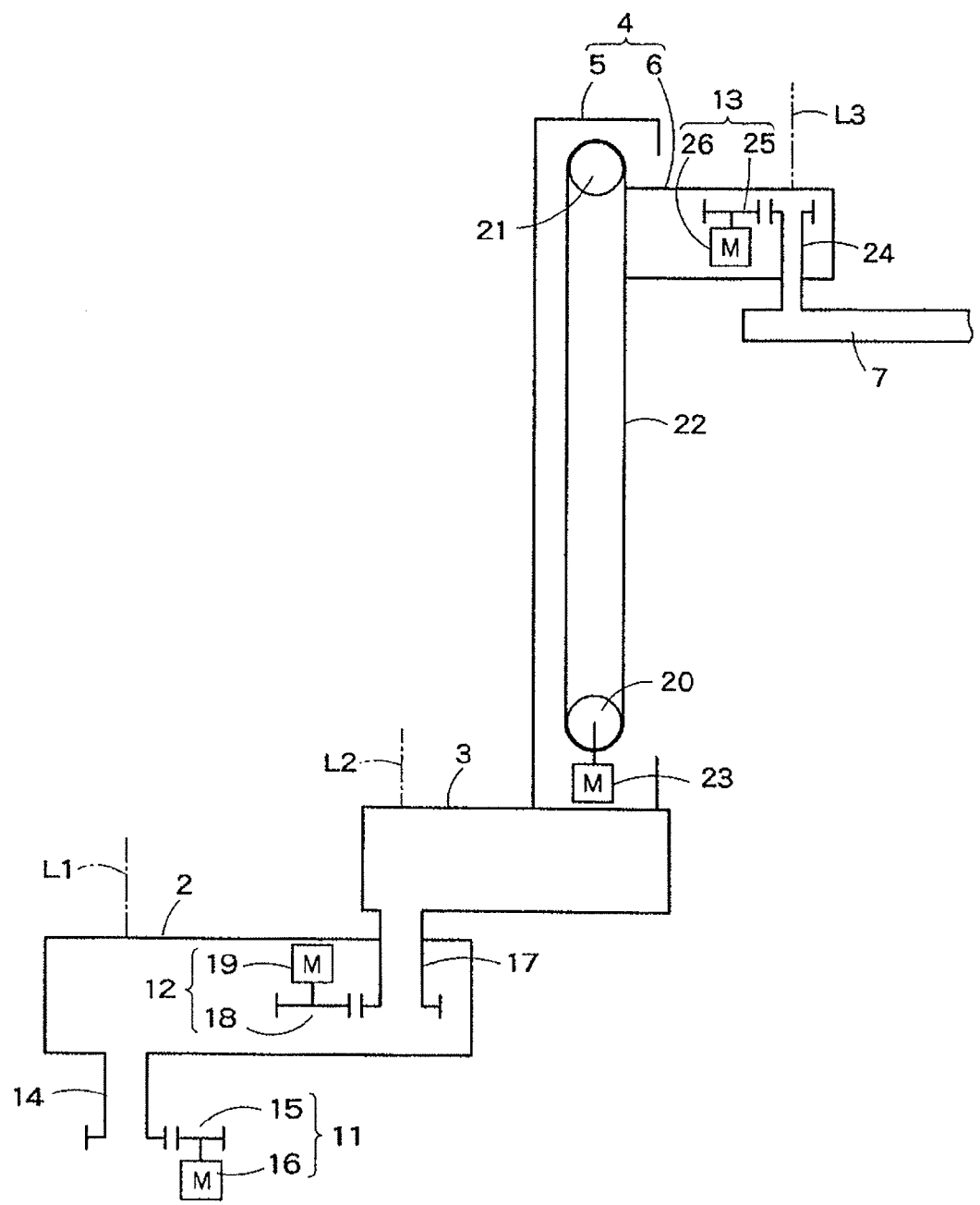
FIG. 3 is a schematic diagram illustrating an inner structure of the conveyance robot illustrated in FIG. 1.

As illustrated in FIG. 3, a first rotation shaft 14 is fixed on the lower surface of the proximal end portion of the first link member 2. This first rotation shaft 14 is driven to rotate by a servomotor 16 through a power transmission mechanism 15, and accordingly the first link member 2 is made to rotate about the first axis L1. The first link drive unit 11 illustrated in FIG. 2 is formed by the power transmission mechanism 15 and the servomotor 16.

A second rotation shaft 17 is fixed on the lower surface of the proximal end portion of the second link member 3, and this second rotation shaft 17 is inserted in a rotatable way in an aperture which is formed on the upper surface of the distal end portion of the hollow first link member 2. This second rotation shaft 17 is driven to rotate by a servomotor 19 through a power transmission mechanism 18 inside the first link member 2, and accordingly the second link member 3 is made to rotate about the second axis L2. The second link drive unit 12 illustrated in FIG. 2 is formed by the power transmission mechanism 18 and the servomotor 19.

The ascending and descending drive unit 4 is fixed on the upper surface on the distal end side of the second link member 3. The ascending and descending drive unit 4 is provided with a drive mechanism (refer to a linearly moving mechanism) that makes the ascending and descending member 6 to ascend and descend, and various sorts of mechanisms are adoptable for this drive mechanism. In this embodiment, a pair of pulleys 20 and 21 are disposed inside the upper and the lower ends of the pillar shaped member 5 which is formed with the hollow member, and a belt 22 is wound around these pulleys, and further the proximal end portion of the ascending and descending member 6 is fixed on this belt 22. Furthermore, the pulley 20 is driven to rotate by a servomotor 23 so that the ascending and descending member 6 are made to ascend and descend together with the belt 22.

A third rotation shaft (wrist shaft) 24 is fixed on the upper surface of the proximal end portion of the substrate holding member 7, and this third rotation shaft 24 is inserted in a rotatable way in an aperture which is formed on the lower surface of the distal end portion of the hollow ascending and descending member 6. This third rotation shaft 24 is driven to rotate by a servomotor 26 through a power transmission mechanism 25 which is inside the ascending and descending member 6, and accordingly the substrate holding member 7 is made to rotate about a third axis L3. A wrist shaft drive unit 13 illustrated in FIG. 2 is formed by the power transmission mechanism 25 and the servomotor 26.

For the power transmission mechanisms 15, 18, and 25, a gear power transmission mechanism provided with a reduction gear is used. The power of the servomotors 16, 19, and 26 is transmitted into the input side of the reduction gear, and its torque is amplified at a predetermined amplification ratio as well as the rotation speed is decelerated at a predetermined deceleration ratio, and output from the output side of the reduction gear. Each rotation shaft 14, 17 and 24 is driven to rotate by the power output from the output side of the reduction gear as described above. Accordingly, the first link member 2, the second link member 3, and the substrate holding member 7 are driven to rotate respectively.

Note that, as a modification, each rotation shaft 14, 17 and 24 can be driven to rotate by using a direct drive motor.

Figure 3A:
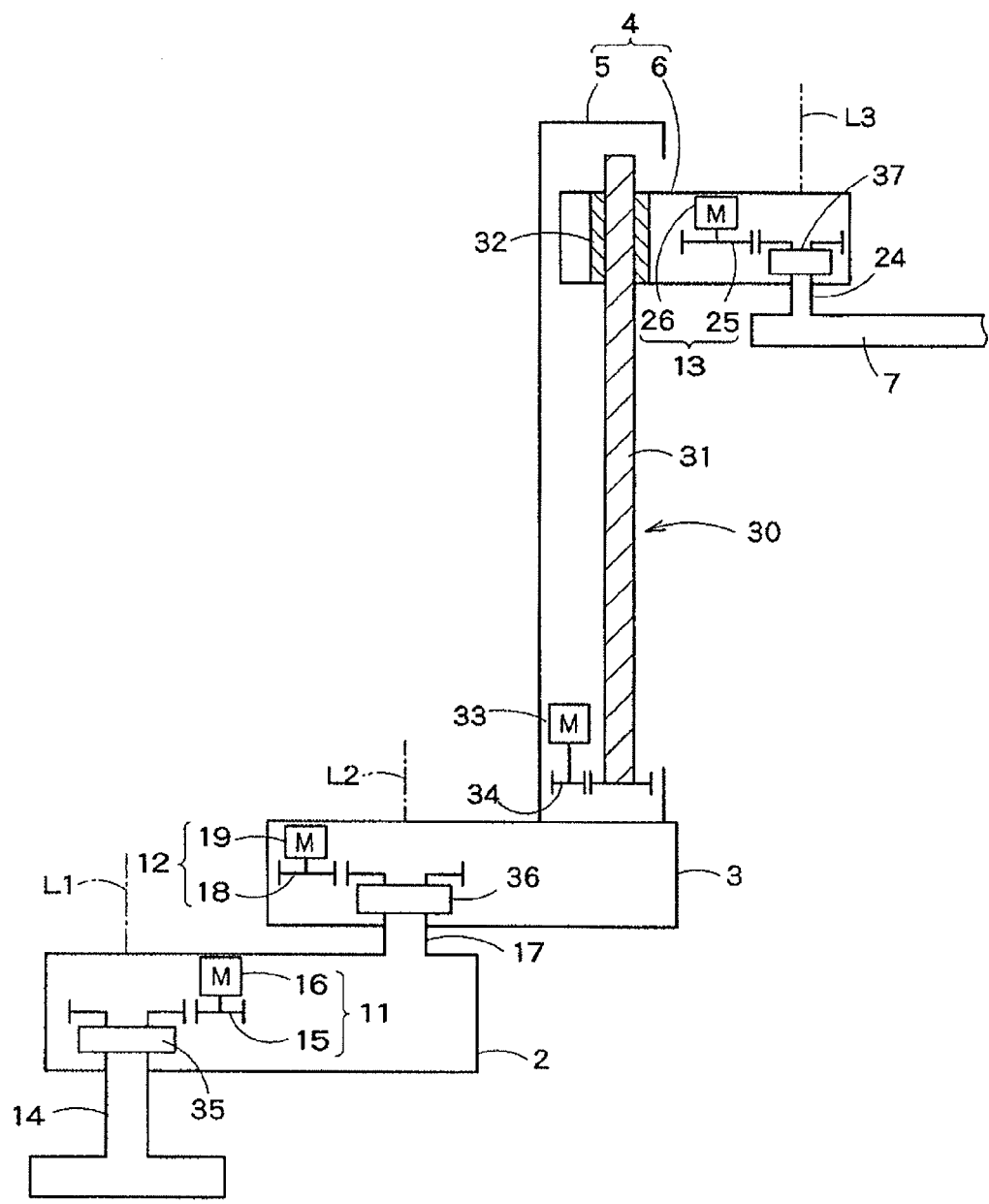
FIG. 3A is a schematic diagram illustrating another example of the inner structure of the conveyance robot illustrated in FIG. 1.

As illustrated in FIG. 3A, as a modification of a drive mechanism (refer to a linearly moving mechanism) in the ascending and descending drive unit 4, it can be realized by a ball screw mechanism 30 provided with a rotation motor whose angular displacement amount can be adjusted. This ball screw mechanism 30 comprises a screw rod 31, a screwed body 32 to be screwed with the screw rod 31, a rotation motor 33 which drives the screw rod 31 to rotate, and a power transmission mechanism 34 which transmits the power of the rotation motor 33 to the screw rod 31. Further, the proximal end portion of the ascending and descending member 6 is fixed to this screwed body 32.

Moreover, in the example illustrated in FIG. 3A, the servomotor 16 and the power transmission mechanism 15 which drive the first link member 2 to rotate is disposed inside the first link member 2, and a reduction gear 35 is positioned between the power transmission mechanism 15 and the first rotation shaft 14.

Similarly, in the example illustrated in FIG. 3A, the servomotor 19 and the power transmission mechanism 18 which drive the second link member 3 to rotate is disposed inside the second link member 3, and a reduction gear 36 is positioned between the power transmission mechanism 18 and the second rotation shaft 17. Furthermore, a reduction gear 37 is positioned between the third rotation shaft 24 (referring to the wrist shaft) and the power transmission mechanism 25.

The robot control unit 10 is able to perform feedback control for respective drive units 11, 12, 4 and 13 by obtaining angular positions of respective servomotors 16, 19, 23, and 26 from respective encoders of the servomotors of the first link drive unit 11, the second link drive unit 12, the ascending and descending drive unit 4, and the wrist shaft drive unit 13, respectively. This enables the substrate holding member 7 to be set precisely at the target position.

Next, the movement of the conveyance robot according to this embodiment will be described with reference to FIG. 4.

Figure 4:
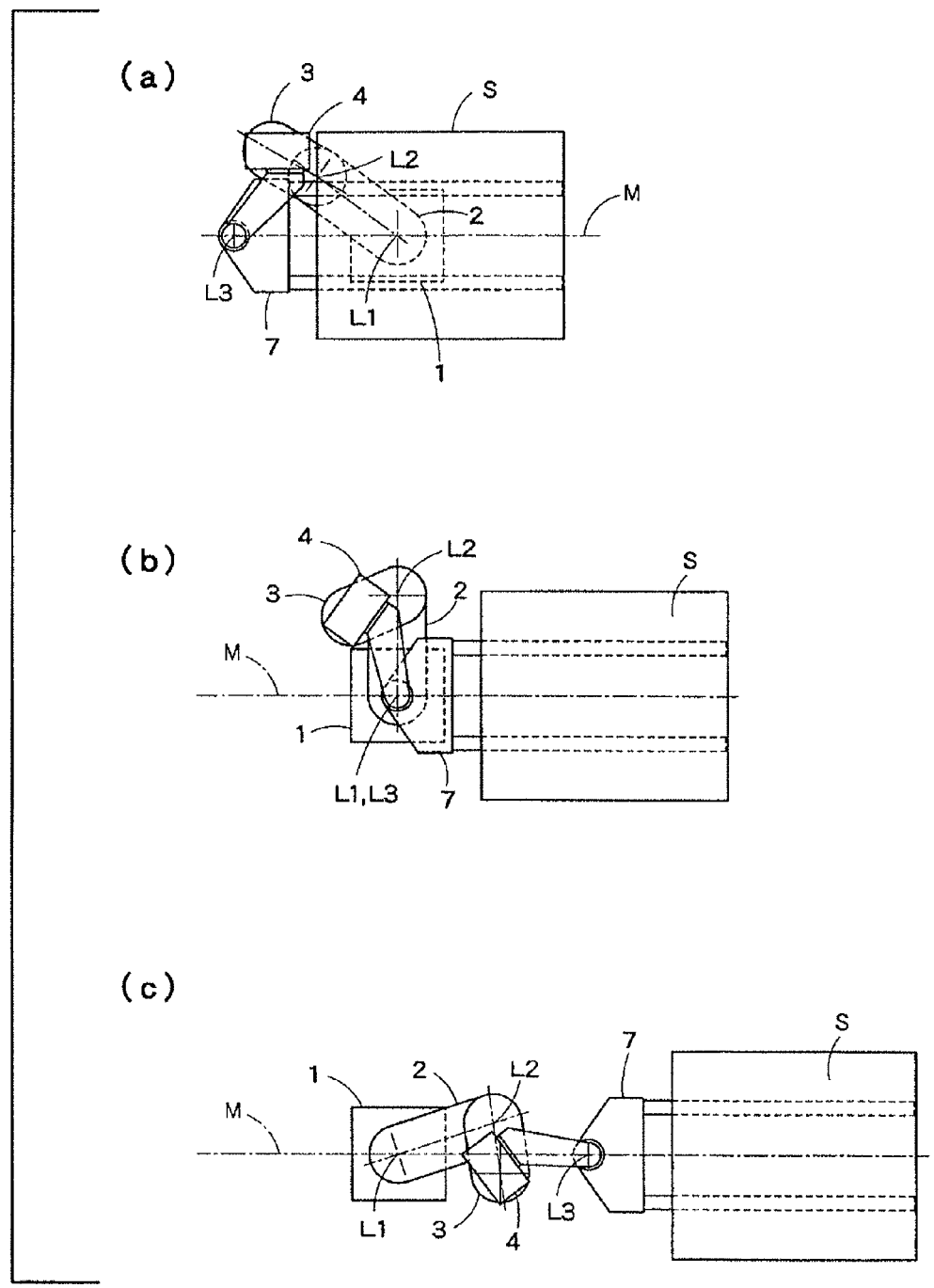
FIG. 4 is a diagram for explaining a movement of the conveyance robot, (a) illustrates a state where a substrate holding member is retracted at the most retracted position on the movement range restriction control, (c) illustrates a state where the substrate holding member is extended at maximum on the movement range restriction control and (b) illustrates the state between the state of (a) and that of (b).

From the position illustrated in FIG. 4 (*a*) where the substrate holding member 7 is set at the most retracted position within a limited movement control range (namely, within a soft limited movement range, or a normal operating movement range), the first link member 2 is rotated clockwise seen from above about the first axis L1. Then, synchronizing with the rotation of the first link member 2, the second link member 3 is rotated counterclockwise seen from above about the second axis L2 (illustrated in FIGS. 4 (*b*), (*c*)). At the same time, the substrate holding member 7 is also rotated clockwise seen from above about the third axis L3, and therefore the direction of the substrate holding member 7 is kept constant.

As can be seen from FIGS. 4 (*a*), (*b*), and (*c*), for the backward and forward movement of the substrate holding member 7, the third axis L3 moves along the common straight line M that passes through the first axis L1. This common straight line M substantially corresponds to the center line of the substrate holding member 7, and the center of the substrate S which is held by the substrate holding member 7 moves along the common straight line M.

Figure 4A:
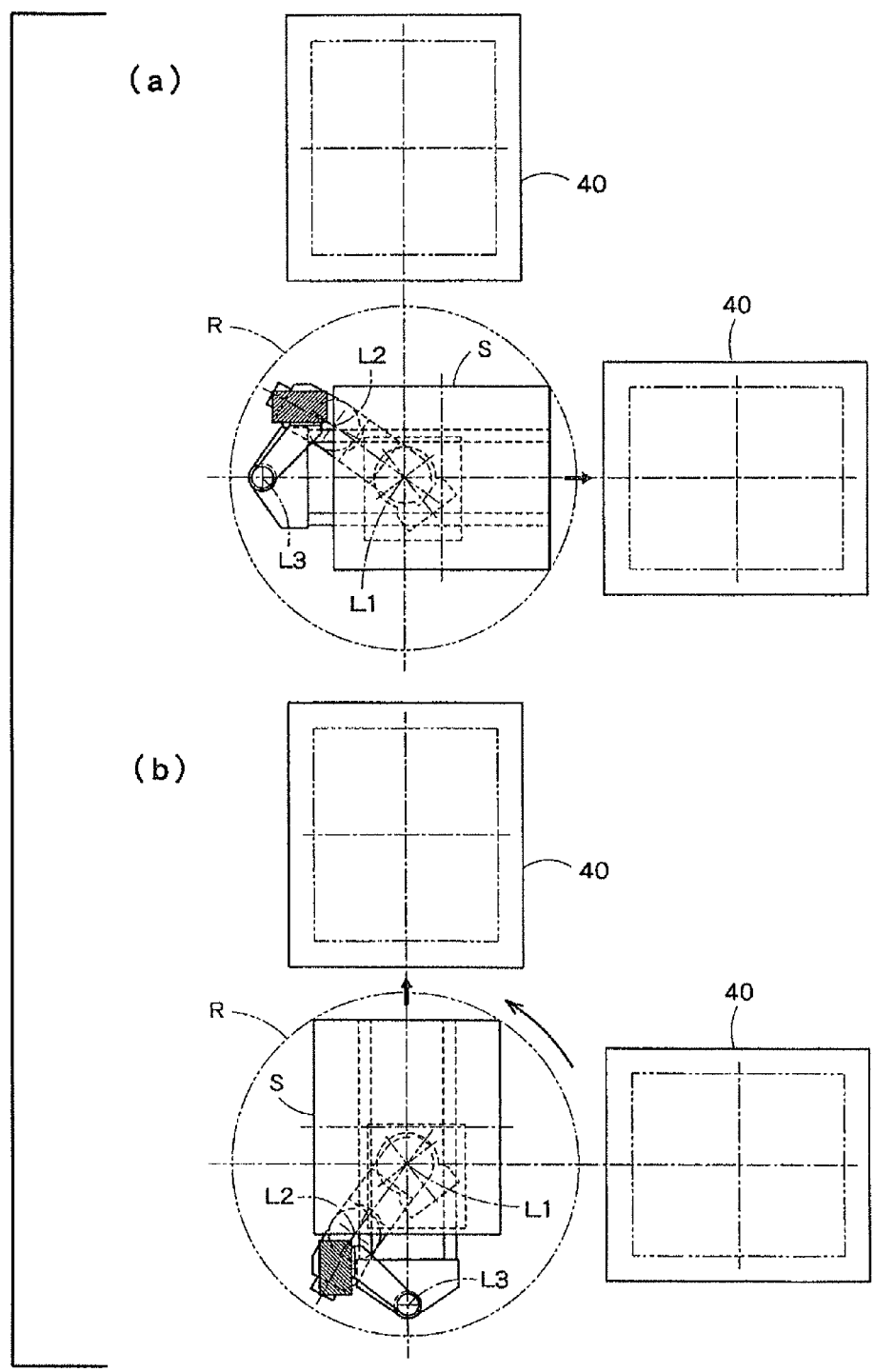
FIG. 4A is a diagram for explaining a rotation movement on its own axis of a robot arm holding a substrate in the conveyance robot illustrated in FIG. 1, (a) illustrates a state where the robot arm faces the direction of one rack, and (b) illustrates a state where the robot arm faces the direction of the other rack.

Note that, when making the robot arm with the substrate S held by the substrate holding member 7 rotate on its own axis, as illustrated FIGS. 4A (*a*) and (*b*), the first link member 2 is rotated about the first axis L1 in the state illustrated in FIG. 4A. By doing so, the substrate S can be carried-in and carried-out from a multiple number of racks 40 which are placed at different positions. Here, since the substrate S is a heavy article, by keeping its center of gravity as close as possible to the first axis L1, the power needed for rotating the robot arm, which holds the substrate S, on its own axis can be reduced, and at the same time, the rotation exclusive area occupied by the substrate S and the robot arm holding the same while rotating on its own axis can be minimized.

This situation is the same for the ascending and descending drive unit 4 which is heavy due to its structure of long length and the use of members with a high degree of rigidity. Taking the above into consideration, in this embodiment, by retracting the ascending and descending drive unit 4 into a position illustrated in FIG. 4(*a*), the center of gravity of the substrate S becomes closer to the first axis L1, and the ascending and descending drive unit 4 is placed as close as possible to the first axis L1, so that its turning radius can be minimized.

As illustrated in FIG. 4A, in this embodiment, each size of the substrate holding member 7, the first link member 2, the second link member 3, and the ascending and descending drive unit 4, and the direction of the ascending and descending drive unit 4 are selected in such a way that the area including the substrate holding member 7 holding the substrate S at the most retracted position on the movement control range, the substrate S held by the substrate holding member 7, the first link member 2, the second link member 3, and the ascending and descending drive unit 4 is placed within a turning area R where a radius is rotated fully about the first axis L1 with the definition of the radius taken from the distance from the first axis L1 to the most distant point of substrate S or the substrate holding member 7.

According to this embodiment with the above mentioned structure, the ascending and descending drive unit 4 is placed between the second link member 3 and the substrate holding member 7, therefore a part which is driven to ascend and descend by the ascending and descending drive unit 4 is not the robot arm as a whole, but is only the substrate holding member 7 which is attached to the ascending and descending member 6. Thus the load applied to the ascending and descending member 6 of the ascending and descending drive unit 4 is reduced, and consequently the drive power needed for the ascending and descending drive unit 4 can also be reduced.

Moreover, in this embodiment, as a unit for moving the ascending and descending drive unit 4 in the horizontal plane, the first link member 2 and the second link member 3 which are a part of the robot arm are used, and this enables the ascending and descending drive unit 4 to move horizontally while minimizing the complication of the structure of the robot.

Moreover, in this embodiment, since the ascending and descending drive unit 4 is disposed on a part of the second link member 3 which is closer to the distal end side relative to the second axis L2, under the state in which the substrate holding member 7 is set at the most retracted position within the limited movement control range as illustrated in FIG. 4(*a*), the ascending and descending drive unit 4 can be placed at a position where the substrate S and the substrate holding member 7 can just avoid their interference with the ascending and descending drive unit 4.

Furthermore, in this embodiment, by keeping the center of gravity of the robot arm which holds substrate S as close as possible to the first axis while rotating on its own axis, together with by minimizing the turning radius of the ascending and descending drive unit 4, the power needed for rotating on its own axis can be reduced, and at the same time the rotation exclusive area occupied by the substrate S and the robot arm holding it can be minimized while rotating on its own axis.

Specifically in this embodiment, the pillar shaped member 5 of the ascending and descending drive unit 4 has a rectangular cross section, and the ascending and descending drive unit 4 is placed in such a way that one side of the rectangular cross section and one side of the substrate S are parallel to each other. This can make the ascending and descending drive unit 4 and the substrate S as close as possible to each other as illustrated in FIG. 4(*a*), and subsequently while placing the ascending and descending drive unit 4 on the second link member 3 at the position closer to the second axis L2, the substrate S can be retracted as much as possible. This enables the rotation exclusive area occupied by the substrate S and the robot arm holding it to be further minimized while rotating on its own axis.

Moreover, since the ascending and descending drive unit 4 is moved to the retracted position (illustrated in FIG. 4(*a*)) by a synthetic movement of a movement of the first link member 2 and that of the second link member 3, during this synthetic movement, the ascending and descending drive unit 4 can move while shortening the distance from the first axis L1. Consequently, compared to a movement by one link member in a form of arc, in this case the distance where the ascending and descending drive unit 4 moves can be shortened while keeping the direction of the substrate S constant, and furthermore as the ascending and descending drive unit 4 which is a heavy article can move while shortening the distance from the first axis L1, the drive power needed for the movement can be reduced.

Moreover, since the ascending and descending drive unit 4 is disposed on a part of the second link member 3 which is closer to the distal end side relative to the second axis L2, as illustrated in FIG. 4(*c*), the ascending and descending drive unit 4 can be positioned on the common straight line M under a state in which the robot arm is extended. This can prevent the weight of the ascending and descending drive unit 4 from acting on the arm in a twisting direction (refer to a roll direction) under the state in which the arm is extended.

Moreover, the ascending and descending member 6 is disposed on the side surface of the pillar shaped member 5 of the ascending and descending drive unit 4, this enables the ascending and descending member 6 together with the substrate holding member 7 to ascend and descend along the side surface of the pillar shaped member 5, therefore, compared to a pantographic type of ascending and descending unit for a conventional conveyance robot, the lowest position of the substrate holding member 7 can be even lowered.

In the following section, a conveyance robot according to another embodiment of the present invention will be described with reference to FIG. 5 to FIG. 8 A.

Figure 5:
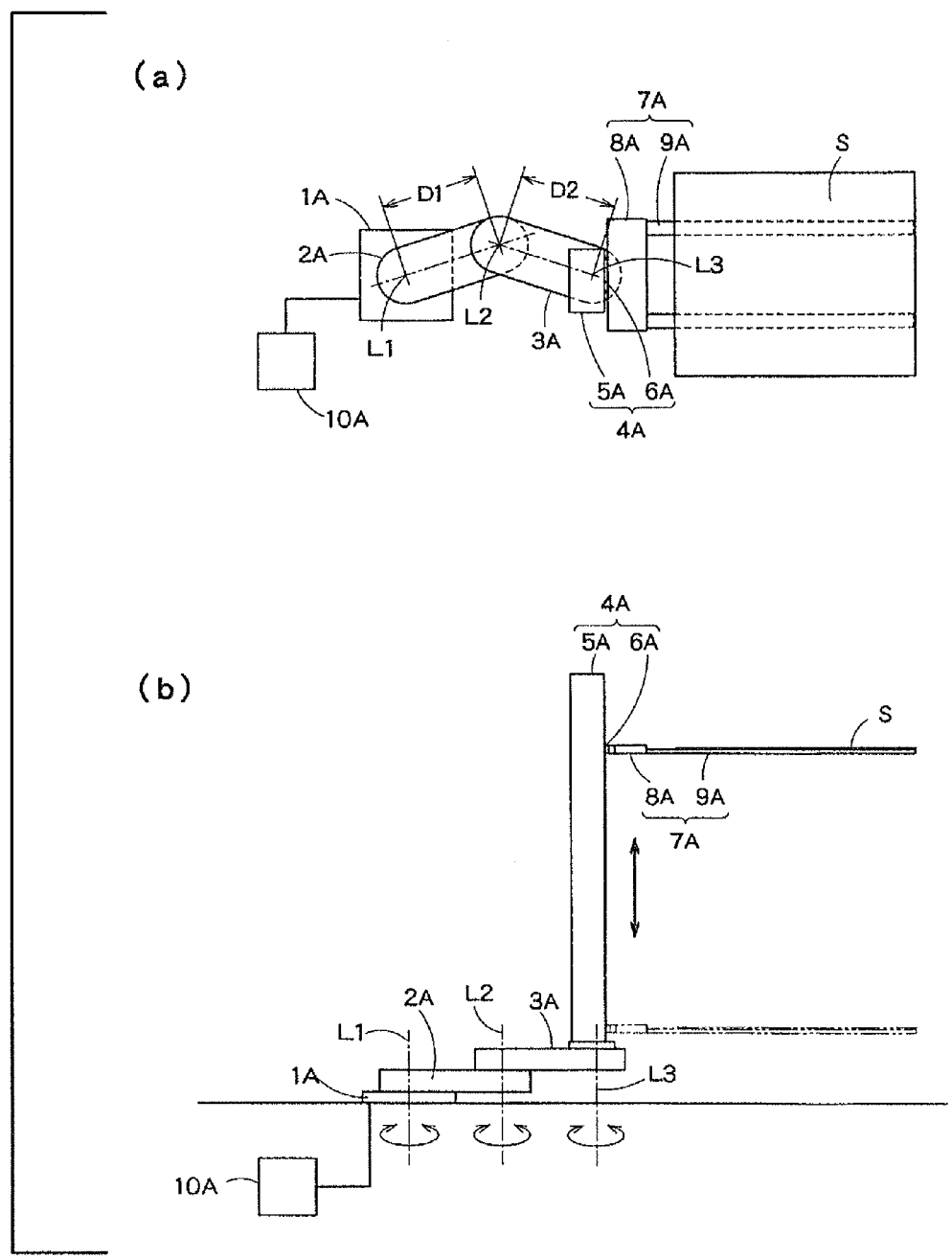
FIG. 5 is a diagram of a conveyance robot according to another embodiment of the present invention, (a) is a plan view, and (b) is a side view.

FIG. 5 illustrates the conveyance robot of the embodiment that has a base 1A. The proximal end portion of a first link member 2A is connected to the base 1A so as to be rotatable about the first axis L1. The proximal end portion of a second link member 3A is connected to the distal end portion of the first link member 2A so as to be rotatable about the second axis L2 which is positioned at a predetermined distance D1 relative to the first axis L1.

Note that, the second link member 3A in this embodiment is longer than the second link member 3 in the embodiment illustrated in FIG. 1, and is equal to the length of the first link member 2A.

An ascending and descending drive unit 4A is disposed on the distal end portion of the second link member 3A, and this ascending and descending drive unit 4A includes a vertically extending pillar shaped member 5A and an ascending and descending member 6A which is disposed so as to be movable upward or downward along the pillar shaped member 5A. In this embodiment, the ascending and descending member 6A is integrally formed with the proximal end portion 8A of the substrate holding member 7A.

The pillar shaped member 5A of the ascending and descending drive unit 4A has a form of a hollow member with an open front surface, and its horizontal cross section is formed into a rectangular shape. The lower end portion of the pillar shaped member 5A is disposed on the distal end portion of the second link member 3A so as to be rotatable about the third axis L3. The third axis L3 is positioned at the predetermined distance D2 relative to the second axis L2, and the distance D2 is equal to the distance D1.

A multiple number of finger parts 9A (in this example, 2 finger parts are shown) extend horizontally from the proximal end portion 8A of the substrate holding member 7A, and the substrate S made of glass is held on the finger parts 9A. Finger parts 9A are provided with a unit for adsorbing the substrate S (not shown) to hold the same.

Rotating axes L1, L2, L3 are parallel to one another and extend in Z axis direction (vertical direction), and the substrate holding member 7A is driven to be displaced with a certain degree of freedom in the X, Y, and Z axis directions.

As mentioned above, in this embodiment, the ascending and descending drive unit 4A is positioned between the second link member 3A and the substrate holding member 7A, and constitutes a part of an arm link mechanism. Moreover, the pillar shaped member 5A of the ascending and descending drive unit 4A is disposed on the distal end portion of the second link member 3A so as to be rotatable, and the pillar shaped member 5A functions as a rotation shaft of the substrate holding member 7A.

Figure 6:
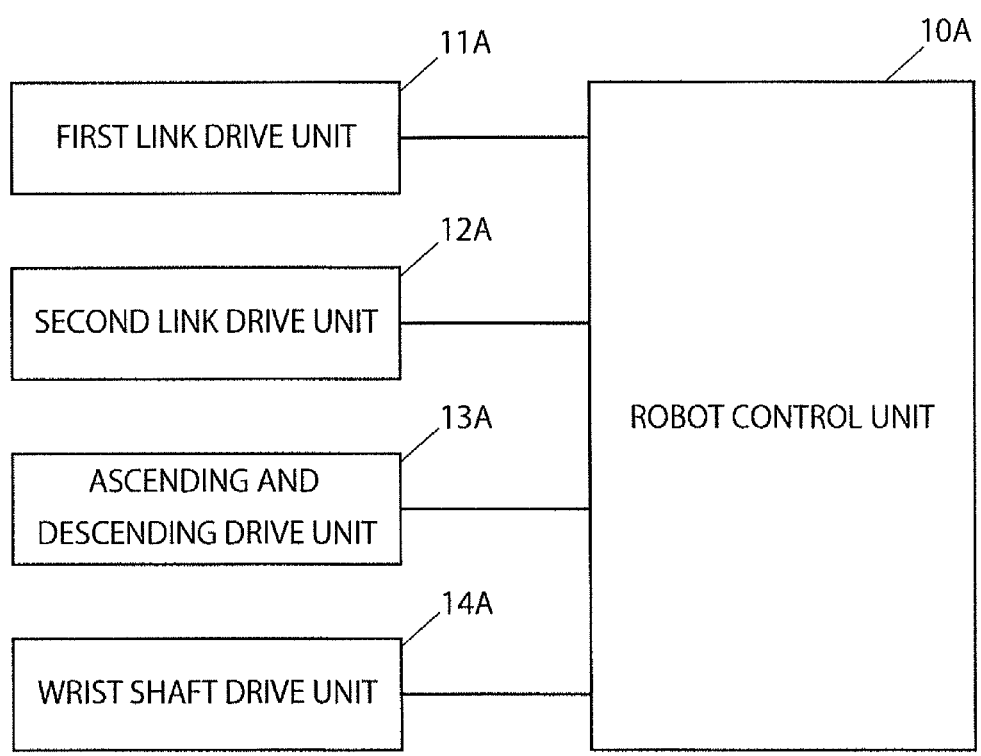
FIG. 6 is a schematic diagram of a constitution of the conveyance robot illustrated in FIG. 5.

As illustrated in FIG. 5 and FIG. 6, the conveyance robot according to this embodiment is provided with a robot control unit 10A, and this robot control unit 10A controls driving of a first link drive unit 11A, a second link drive unit 12A, the ascending and descending drive unit 4A, and a wrist axis drive unit 13A.

Figure 7:
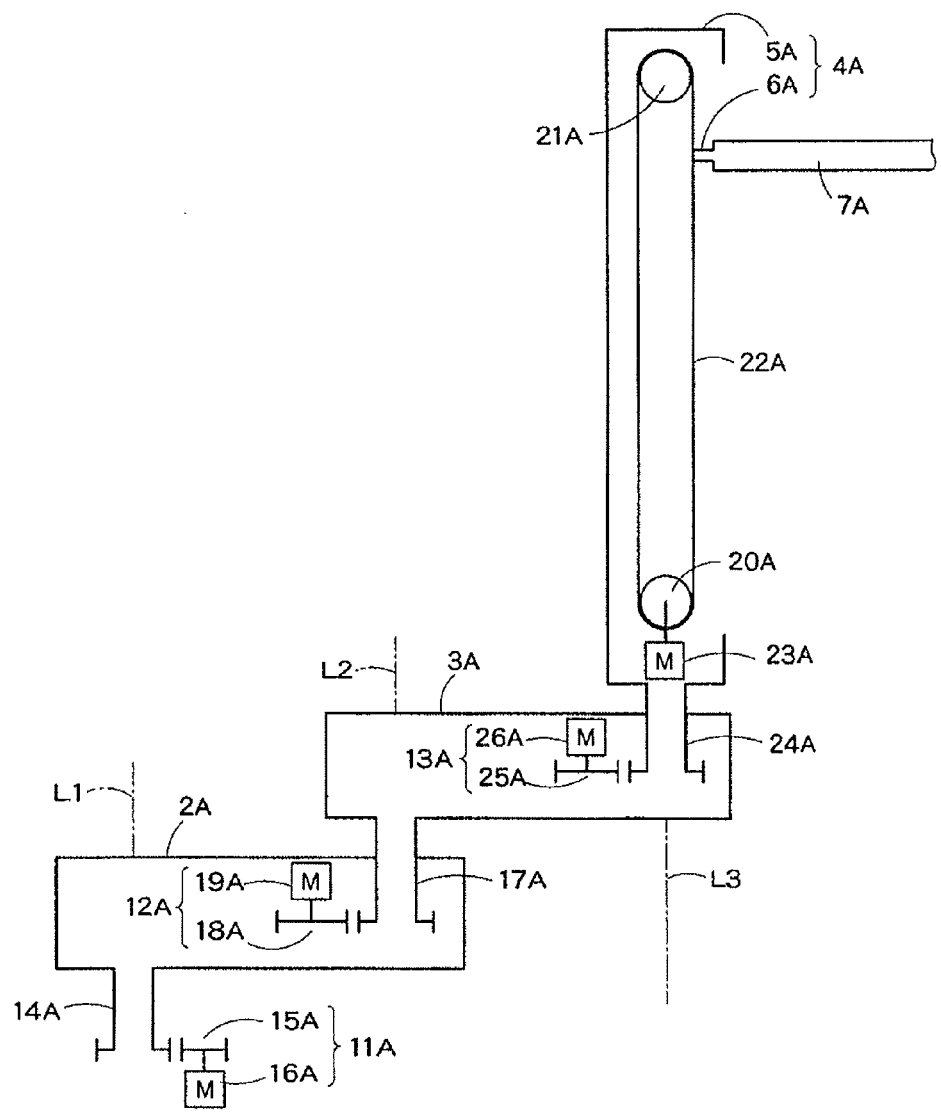
FIG. 7 is a schematic diagram illustrating an inner structure of the conveyance robot illustrated in FIG. 5.

As illustrated in FIG. 7, a first rotation shaft 14A is fixed on the lower surface of the proximal end portion of the first link member 2A. This rotation shaft 14A is driven to rotate by a servomotor 16A through a power transmission mechanism 15A, and accordingly the first link member 2A is made to rotate about the first axis L1. The first link drive unit 11A illustrated in FIG. 6 is formed by the power transmission mechanism 15A and the servomotor 16A.

A second rotation shaft 17A is fixed on the lower surface of the proximal end portion of the second link member 3A, and this second rotation shaft 17A is inserted in a rotatable way in an aperture which is formed on the upper surface of the distal end portion of the hollow first link member 2A. This second rotation shaft 17A is driven to rotate by a servomotor 19A through a power transmission mechanism 18A inside the first link member 2A, and accordingly the second link member 3A is made to rotate about the second axis L2. The second link drive unit 12A illustrated in FIG. 6 is formed by the power transmission mechanism 18A and the servomotor 19A.

A third rotation shaft (refer to a wrist shaft) 24A is fixed on the lower end portion of the pillar shaped member 5A of the ascending and descending drive unit 4A, and this third rotation shaft 24A is inserted in a rotatable way in an aperture which is formed on the upper surface of the distal end portion of the hollow second link member 3A. This third rotation shaft 24A is driven to rotate by a servomotor 26A through a power transmission mechanism 25A which is inside the second link member 3A, and accordingly the ascending and descending drive unit 4A is made to rotate about a third axis L3. A wrist shaft drive unit 13A illustrated in FIG. 6 is constituted with the power transmission mechanism 25A and the servomotor 26A.

The ascending and descending drive unit 4A is provided with a drive mechanism (refer to a linearly moving mechanism) that makes the ascending and descending member 6 to ascend and descend, and various sorts of mechanisms are adoptable for this drive mechanism. In this embodiment, a pair of pulleys 20A and 21A are disposed inside the upper and the lower ends of the pillar shaped member 5A which is formed with the hollow member, and a belt 22A is wound around these pulleys, and further the ascending and descending member 6A, which is integrally formed with the substrate holding member 7A, is fixed on this belt 22A. Furthermore, the pulley 20A is driven to rotate by a servomotor 23A, and accordingly the ascending and descending member 6A and the substrate holding member 7A are made to ascend and descend together with the belt 22A.

For the power transmission mechanisms 15A, 18A, and 25A, a gear power transmission mechanism provided with a reduction gear is used. The power of the servomotors 16A, 19A, and 26A is transmitted into the input side of the reduction gear, and its torque is amplified at a predetermined amplification ratio as well as the rotation speed is decelerated at a predetermined deceleration ratio, and is output from the output side of the reduction gear. Each rotation shaft 14A, 17A and 24A is driven to rotate by the power output from the output side of the reduction gear as described above. Accordingly, the first link member 2A, the second link member 3A, and the substrate holding member 7A are driven to rotate respectively.

Note that, as a modification, each rotation shaft 14A, 17A and 24A can be driven to rotate by using a direct drive motor.

Furthermore, as a modification for the drive mechanism (refer to the linearly moving mechanism) in the ascending and descending drive unit 4A, it can be realized by applying a ball screw mechanism using a rotation motor whose angular displacement amount can be adjusted. This ball screw mechanism includes a screw rod, a screwed body to be screwed with the screw rod, a rotation motor which drives the screw rod to rotate, and the ascending and descending member 6A is fixed on this screwed body.

The robot control unit 10A is able to perform feedback control for respective drive units 11A, 12A, 13A and 4A by obtaining angular positions of respective servomotors 16A, 19A, 26A, and 23A from respective encoders of the servomotors of the first link drive unit 11A, the second link drive unit 12A, the wrist shaft drive unit 13A, and the ascending and descending drive unit 4A respectively. This enables the substrate holding member 7A to be set precisely at the target position.

Next, with reference to FIG. 8, a movement of a conveyance robot according to this embodiment will be explained below.

Figure 8:
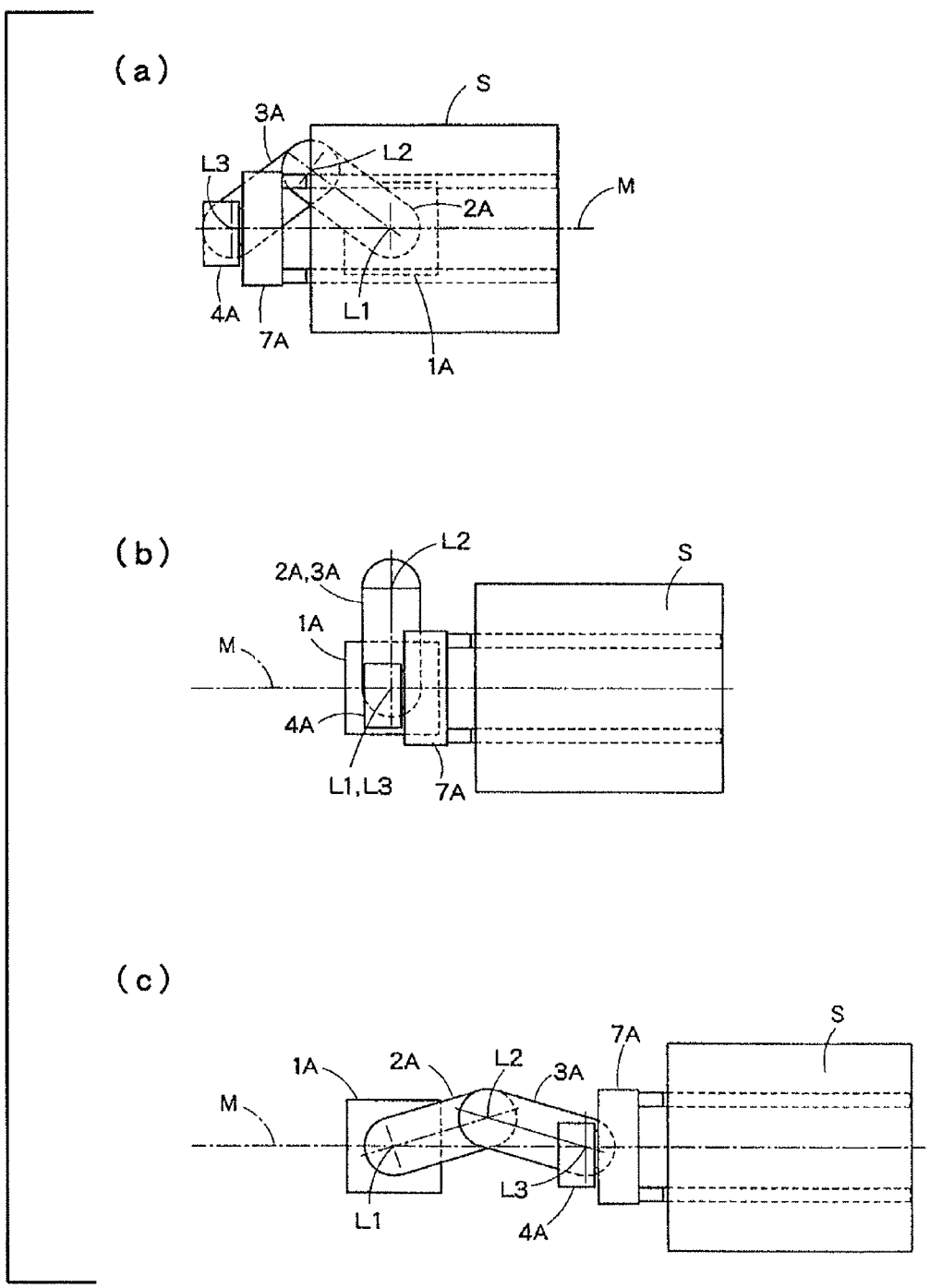
FIG. 8 is a diagram for explaining a movement of the conveyance robot illustrated in FIG. 5, (a) illustrates a state where a substrate holding member is retracted at the most retracted position on the movement range restriction control, (c) illustrates a state where the substrate holding member is extended at maximum on the movement range restriction control, and (b) illustrates a state between the state of (a) and that of (b).

From the position illustrated in FIG. 8 (*a*) where the substrate holding member 7A is set at the most retracted position within a limited movement control range, the first link member 2A is rotated clockwise seen from above about the first axis L1. Then, synchronizing with the rotation of the first link member 2A, the second link member 3A is rotated counterclockwise seen from above about the second axis L2 (illustrated in FIGS. 8 (*b*), (*c*)). At the same time, the ascending and descending drive unit 4A together with the substrate holding member 7A is also rotated clockwise seen from above about the third axis L3, and therefore the direction of the substrate holding member 7A is kept constant.

As illustrated in FIGS. 8(*a*), (*b*), and (*c*), for the backward and forward movement of the substrate holding member 7A, the third axis L3 moves along the common straight line M that passes through the first axis L1. This common straight line M substantially corresponds to a center line of the substrate holding member 7A, and the center of the substrate S which is held by the substrate holding member 7A moves along the common straight line M.

Figure 8A:
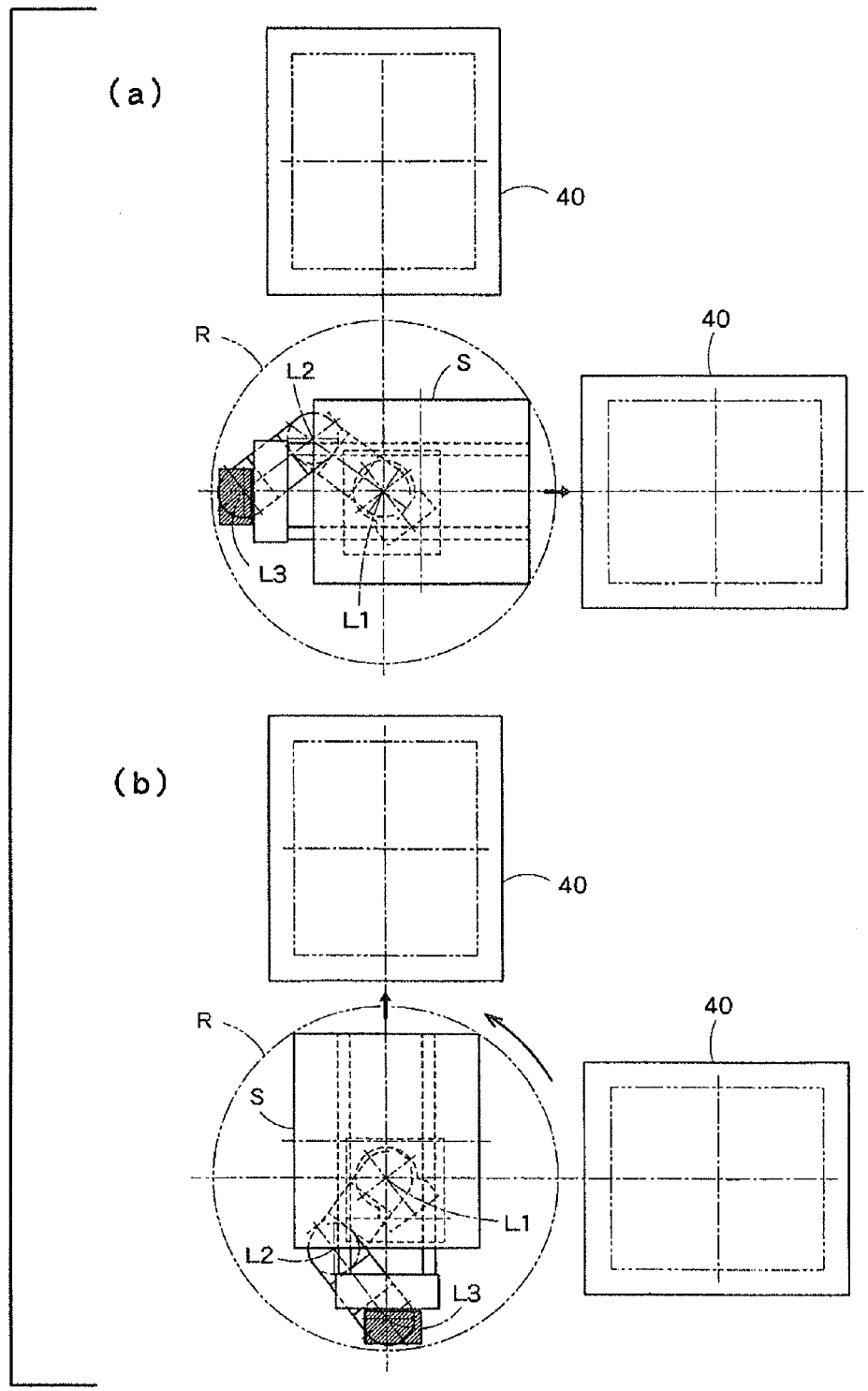
FIG. 8A is a diagram for explaining a rotation movement on its own axis of a robot arm holding the substrate in the conveyance robot illustrated in FIG. 5, (a) illustrates a state where the robot arm faces the direction of one rack, and (b) illustrates a state where the robot arm faces the direction of the other rack.

Note that, when making the robot arm with the substrate S held by the substrate holding member 7A to rotate on its own axis, as illustrated FIGS. 8A (*a*) and (*b*), the first link member 2A is rotated about the first axis L1 in the state illustrated in FIG. 8 (*a*). By doing so, the substrate S can be carried-in and carried-out from a multiple number of racks 40 which are placed at the different positions. Since the substrate S is a heavy article, by keeping its center of gravity as close as possible to the first axis L1, the power needed for rotating the robot arm, which holds the substrate S, on its own axis can be reduced, and at the same time, the rotation exclusive area occupied by the substrate S and the robot arm holding the same while rotating on its own axis can be minimized. This situation is the same for the ascending and descending drive unit 4 which is also a heavy article. Taking the above into consideration, in this embodiment, by retracting the ascending and descending drive unit 4 into a position illustrated in FIG. 8(*a*), the center of gravity of the substrate S becomes closer to the first axis L1, and furthermore the turning radius of the ascending and descending drive unit 4 can be minimized.

As illustrated in FIG. 8A, in this embodiment, each size of the substrate holding member 7A, the first link member 2A, the second link member 3A, and the ascending and descending drive unit 4A, and the direction of the ascending and descending drive unit 4A are selected in such a way that the area including the substrate holding member 7A holding the substrate S at the most retracted position on the movement control range, the substrate S held by the substrate holding member 7A, the first link member 2A, the second link member 3A, and the ascending and descending drive unit 4A are placed within a turning area R where a radius is rotated fully about the first axis L1 with the definition of the radius taken from the distance from the first axis L1 to the most distant point of substrate S or the substrate holding member 7A.

According to this embodiment with the above mentioned structure, the ascending and descending drive unit 4A is placed between the second link member 3A and the substrate holding member 7A, therefore a part which is driven to ascend and descend by the ascending and descending drive unit 4A is not the robot arm as a whole, but is only the substrate holding member 7A which is integrally formed with the ascending and descending member 6A. Therefore, the load of the ascending and descending member 6A of the ascending and descending drive unit 4A is reduced, and consequently the drive power needed for the ascending and descending drive unit 4A can also be reduced.

Specifically in this embodiment which differs from the embodiment shown in FIG. 1, since the ascending and descending drive unit 4A is rotatably disposed on the second link member 3A as well as the substrate holding member 7A is directly disposed on the ascending and descending drive unit 4A, the wrist axis drive unit 13A can be excluded from an ascending and descending object, and therefore the drive power needed for the ascending and descending drive unit 4A can be further reduced.

Moreover, in this embodiment, by keeping the center of gravity of the robot arm which holds the substrate S as close to the first axis L1 as possible while rotation on its own axis, and by minimizing the turning radius of the ascending and descending drive unit 4, the power needed for rotation on its own axis can be reduced, and further the rotation exclusive area occupied by the substrate S as well as the robot arm holding the same while rotating on its own axis can be minimized.

Moreover, in this embodiment, as a unit for moving the ascending and descending drive unit 4A in the horizontal plane, the first link member 2A and the second link member 3A which are parts of the robot arm are used, and this enables the ascending and descending drive unit 4A to move horizontally while minimizing the complication of the structure of the robot.

Moreover, since the ascending and descending drive unit 4 is moved to the retracted position (illustrated in FIG. 8 (a)) by a synthetic movement of a movement of the first link member 2A and that of the second link member 3A, during this synthetic movement, the ascending and descending drive unit 4 can move while shortening the distance from the first axis L1. Consequently, compared to a movement by one link member in a form of arc, in this case the moving distance of the ascending and descending drive unit 4A can be shortened while keeping the direction of the substrate S constant, and furthermore as the ascending and descending drive unit 4 which is a heavy article can move while shortening the distance from the first axis L1, the drive power needed for the movement can also be reduced.

Moreover, since the ascending and descending drive unit 4A is disposed on the distal end portion of the second link member 3A, as illustrated in FIG. 8(c) the ascending and descending drive unit 4A can be positioned on the common straight line M under a state in which the robot arm is extended. This can prevent the weight of the ascending and descending drive unit 4A from acting on the arm in a twisting direction (refer to a roll direction) under the state in which the arm is extended.

Moreover, in this embodiment, as the ascending and descending drive unit 4A is positioned on the common straight line M throughout a substrate conveyance movement, and the ascending and descending drive unit 4A moves in a straight line, vibration during conveyance can be suppressed.

Moreover, the ascending and descending member 6A is disposed on the side surface of the pillar shaped member 5A of the ascending and descending drive unit 4A, and this enables the ascending and descending member 6A together with the substrate holding member 7A to ascend and descend along the side surface of the pillar shaped member 5A. Therefore, compared to a pantographic type of ascending and descending unit for a conventional conveyance robot, the lowest position of the substrate holding member 7A can be further lowered.

Next, with reference to the FIG. 9 to FIG. 12A, a conveyance robot according to still another embodiment of the present invention will be explained below.

Figure 9:
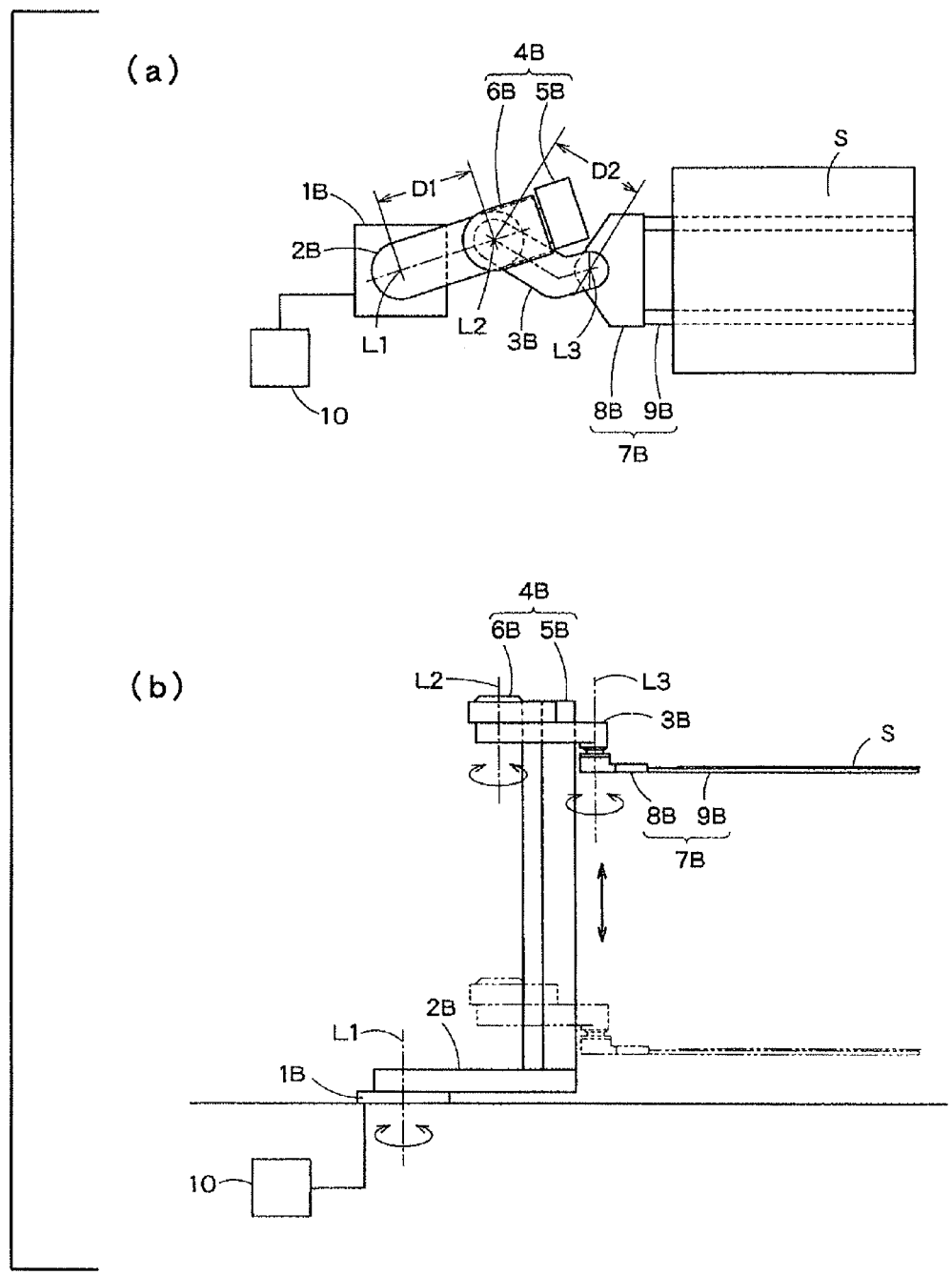
FIG. 9 is a diagram illustrating a conveyance robot according to still another embodiment of the present invention, (a) is a plan view, and (b) is a side view.

FIG. 9 illustrates the conveyance robot according to the embodiment that has a base 1B, and the proximal end portion of a first link member 2B is connected to the base 1B so as to be rotatable about a first axis L1.

An ascending and descending drive unit 4B is disposed on the distal end portion of a first link member 2B, and this ascending and descending drive unit 4B includes a vertically extending pillar shaped member 5B and an ascending and descending member 6B which is disposed so as to be movable upward and downward along the pillar shaped member 5B. The pillar shaped member 5B of the ascending and descending drive unit 4B has a form of a hollow member with an open front surface, and its horizontal cross section is formed into a rectangular shape. The lower end portion of the pillar shaped member 5B is fixed on the upper surface of the proximal end portion of the first link member 2B.

The proximal end portion of the second link member 3B is connected to the ascending and descending member 6B of the ascending and descending drive unit 4B so as to be rotatable about a second axis L2 which is positioned at a predetermined distance D1 relative to the first axis L1. The ascending and descending member 6B extends horizontally and has a protruding shape which is bent.

A proximal end portion of a substrate holding member 7B is connected to the lower surface of a distal end portion of the second link member 3B so as to be rotatable about a third axis L3. The third axis L3 is positioned at a predetermined distance D2 relative to the second axis L2, and this distance D2 is equal to the distance D1.

A multiple number of finger parts 9B (in this example, 2 finger parts are shown) extend horizontally from the proximal end portion 8B of the substrate holding member 7B, and a substrate S made of glass is held on finger parts 9B. Finger parts 9B are provided with a unit for adsorbing the substrate S (not shown) to hold the same.

Rotating axes L1, L2, L3 are parallel to one another and extend in Z axis direction (vertical direction), and the substrate holding member 7B is driven to be displaced with a certain degree of freedom in the X, Y, and Z axis directions.

As described above, in this embodiment, the ascending and descending drive unit 4B is positioned between the first link member 2B and the second link member 3, and constitutes a part of an arm link mechanism.

Figure 10:
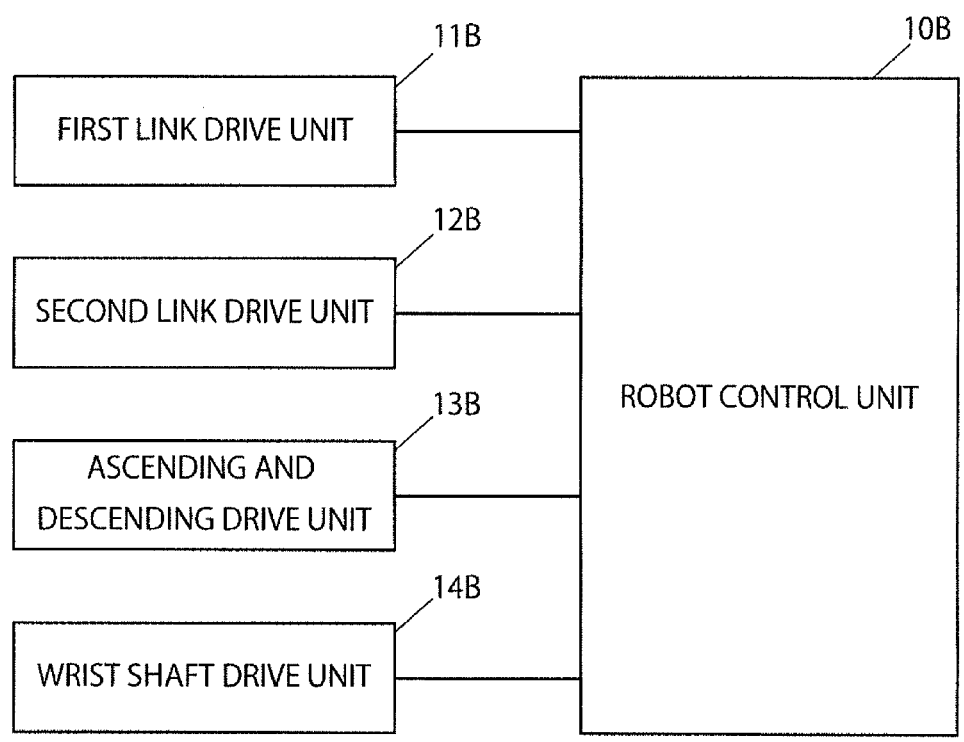
FIG. 10 is a schematic diagram of a constitution of the conveyance robot illustrated in FIG. 9.

As illustrated in FIG. 9 and FIG. 10, the conveyance robot according to this embodiment is provided with a robot control unit 10B, and this robot control unit 10B controls driving of a first link drive unit 11B, a second link drive unit 12B, the ascending and descending drive unit 4B, and a wrist axis drive unit 13B.

Figure 11:
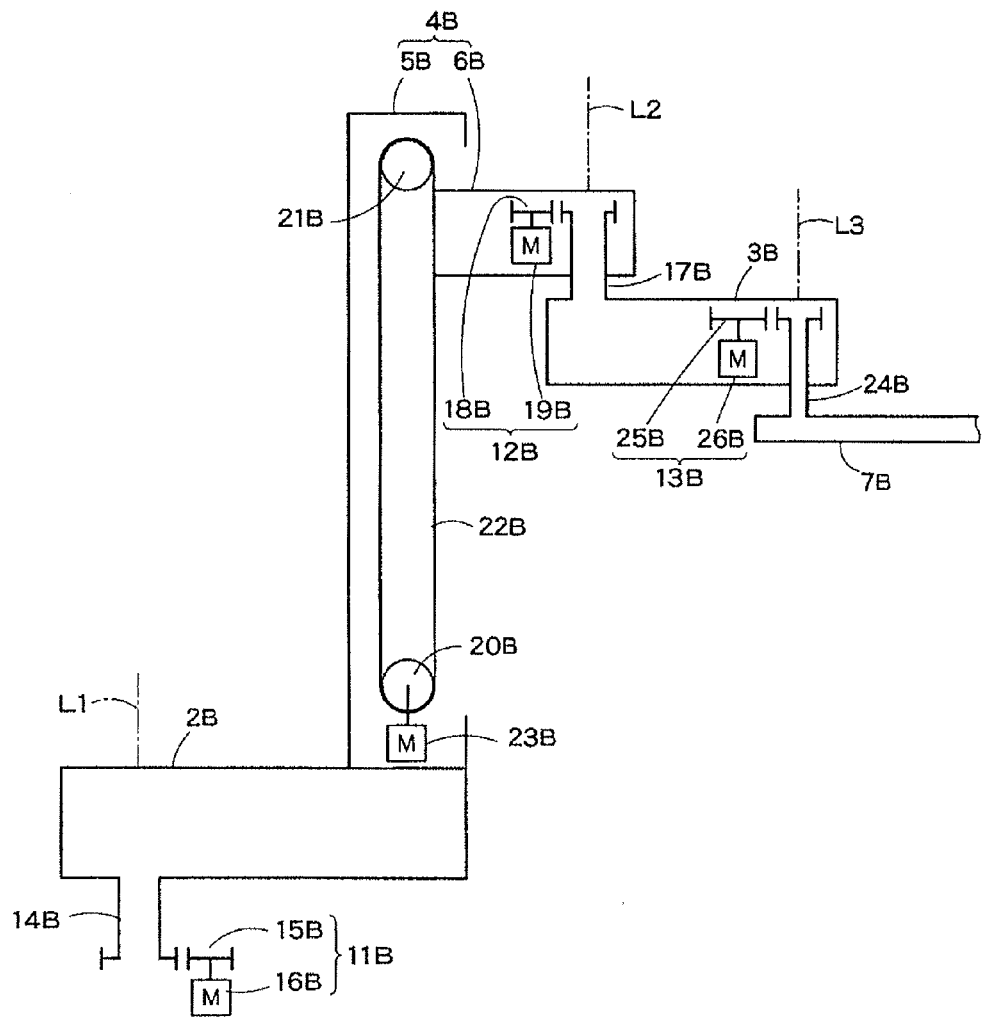
FIG. 11 is a schematic diagram illustrating an inner structure of the conveyance robot illustrated in FIG. 9.

As illustrated in FIG. 11, a first rotation shaft 14B is fixed on the lower surface of the proximal end portion of the first link member 2B. This first rotation shaft 14B is driven to rotate by a servomotor 16B through a power transmission mechanism 15B, and accordingly the first link member 2B is made to rotate about the first axis L1. The first link drive unit 11B illustrated in FIG. 10 is constituted with the power transmission mechanism 15B and the servomotor 16B.

The ascending and descending drive unit 4B is fixed on the upper surface of the distal end portion of the first link member 2B. The ascending and descending drive unit 4B is provided with a drive mechanism (refer to a linearly moving mechanism) that makes the ascending and descending member 6B ascend and descend, and various sorts of mechanisms are adoptable for this drive mechanism. In this embodiment, a pair of pulleys 20B and 21B are disposed inside the upper and the lower ends of the pillar shaped member 5B which is formed with the hollow member, and a belt 22B is wound around these pulleys, and further the proximal end portion of the ascending and descending member 6B is fixed on this belt 22B. Furthermore, the pulley 20B is driven to rotate by a servomotor 23B, and accordingly the ascending and descending member 6B is made to ascend and descend together with the belt 22B.

A second rotation shaft 17B is fixed on the upper surface of the proximal end portion of the second link member 3B, and this second rotation shaft 17B is inserted in a rotatable way in an aperture which is formed on the lower surface of the distal end portion of the hollow ascending and descending member 6B. This second rotation shaft 17B is driven to rotate by a servomotor 19B through a power transmission mechanism 18B inside the ascending and descending member 6B, and accordingly the second link member 3B is made to rotate about the second axis L2. The second link drive unit 12B illustrated in FIG. 10 is constituted with the power transmission mechanism 18B and the servomotor 19B.

A third rotation shaft (wrist shaft) 24B is fixed on the upper surface of the proximal end portion of the substrate holding member 7B, and this third rotation shaft 24B is inserted in a rotatable way in an aperture which is formed on the lower surface of the distal end portion of the second link member 3B. This third rotation shaft 24B is driven to rotate by a servomotor 26B through a power transmission mechanism 25B which is inside the second link member 3B, and accordingly the substrate holding member 7B is made to rotate about the third axis L3. A wrist shaft drive unit 13B illustrated in FIG. 10 is constituted with the power transmission mechanism 25B and the servomotor 26B.

For the power transmission mechanisms 15B, 18B, and 25B, a gear power transmission mechanism provided with a reduction gear is used. The power of the servomotors 16B, 19B, and 26B is transmitted into the input side of the reduction gear, and its torque is amplified by a predetermined amplification ratio as well as the rotation speed is decelerated by a predetermined deceleration ratio, and output from the output side of the reduction gear. Each rotation shaft 14B, 17B and 24B is driven to rotate by the power output from the output side of the reduction gear described above. Accordingly, the first link member 2B, the second link member 3B, and the substrate holding member 7B are driven to rotate respectively.

Note that, as a modification, each rotation shaft 14B, 17B and 24B can be driven to rotate by using a direct drive motor.

As another modification for the drive mechanism (refer to the linearly moving mechanism) in the ascending and descending drive unit 4B, it can be realized by a ball screw mechanism by using a rotation motor whose angular displacement amount can be adjusted. This ball screw mechanism includes a screw rod, a screwed body to be screwed with the screw rod, a rotation motor which drives the screw rod to rotate, and the proximal end portion of the ascending and descending member 6B is fixed on the screwed body.

The robot control unit 10B is able to perform feedback control for respective drive units 11B, 4B, 12B, and 13B by obtaining angular positions of respective servomotors 16B, 23B, 19B, and 26B from respective encoders of the servomotors of the first link drive unit 11B, the ascending and descending drive unit 4B, the second link drive unit 12B, and the wrist shaft drive unit 13B respectively. This enables the substrate holding member 7B to be set precisely at the target position.

Next, with reference to FIG. 12, a movement of a conveyance robot according to this embodiment will be explained below.

Figure 12:
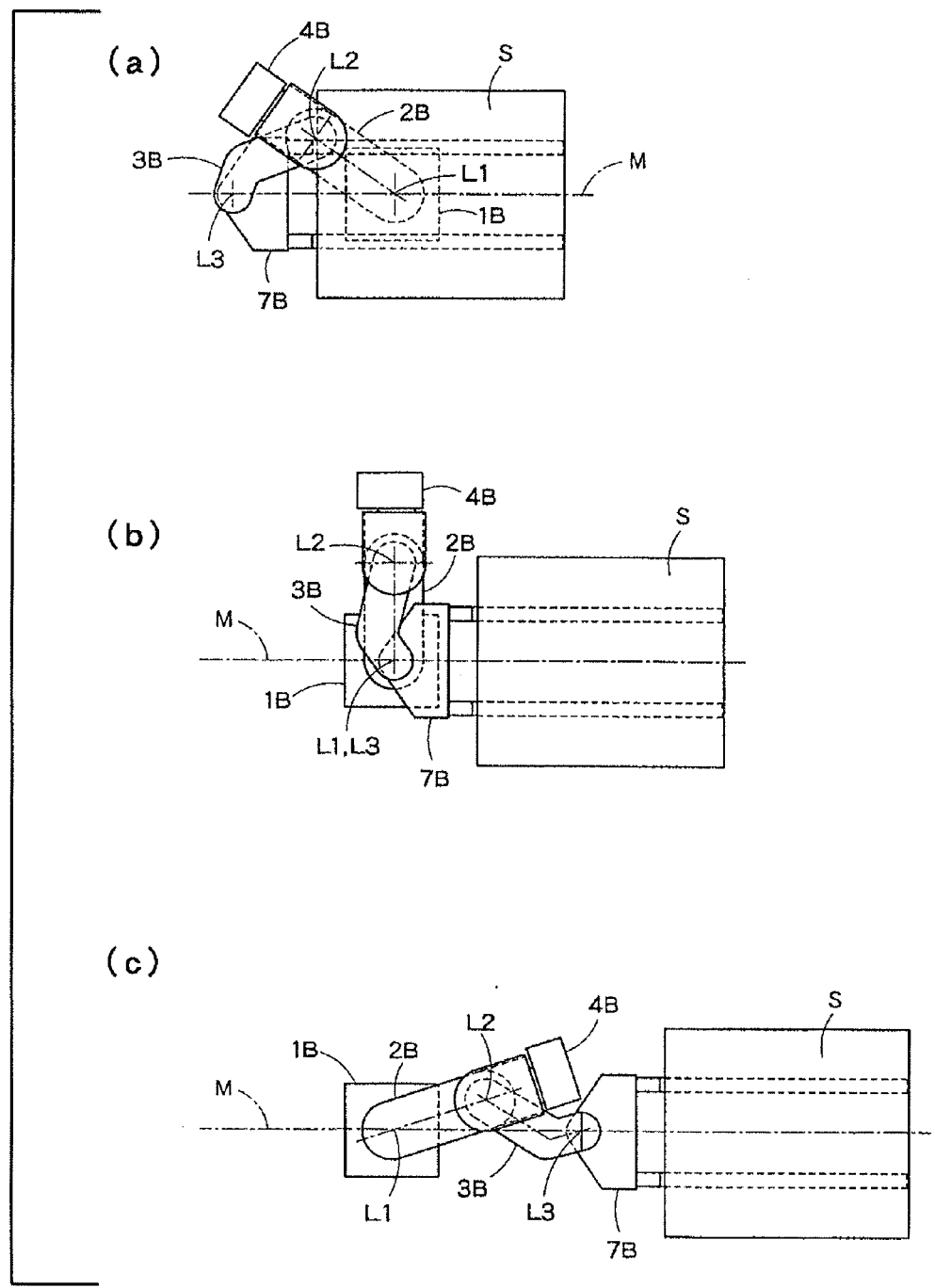
FIG. 12 is a diagram for explaining a movement of the conveyance robot illustrated in FIG. 9, (a) illustrates a state where a substrate holding member is retracted at the most retracted position on the movement range restriction control, (c) illustrates a state where the substrate holding member is extended at maximum on the movement range restriction control, and (b) illustrates a state between the state of (a) and that of (b).

From the position illustrated in FIG. 12 (a) where the substrate holding member 7B is set at the most retracted position within a limited movement control range, the first link member 2B is rotated clockwise seen from above together with the ascending and descending drive unit 4B about the first axis L1. Then, synchronizing with the rotation of the first link member 2B, the second link member 3B is rotated counterclockwise seen from above about the second axis L2 (illustrated in FIGS. 12 (b), (c)). At this time, the substrate holding member 7B is also rotated clockwise seen from above about the third axis L3, and therefore the direction of the substrate holding member 7B is kept constant.

Figure 12A:
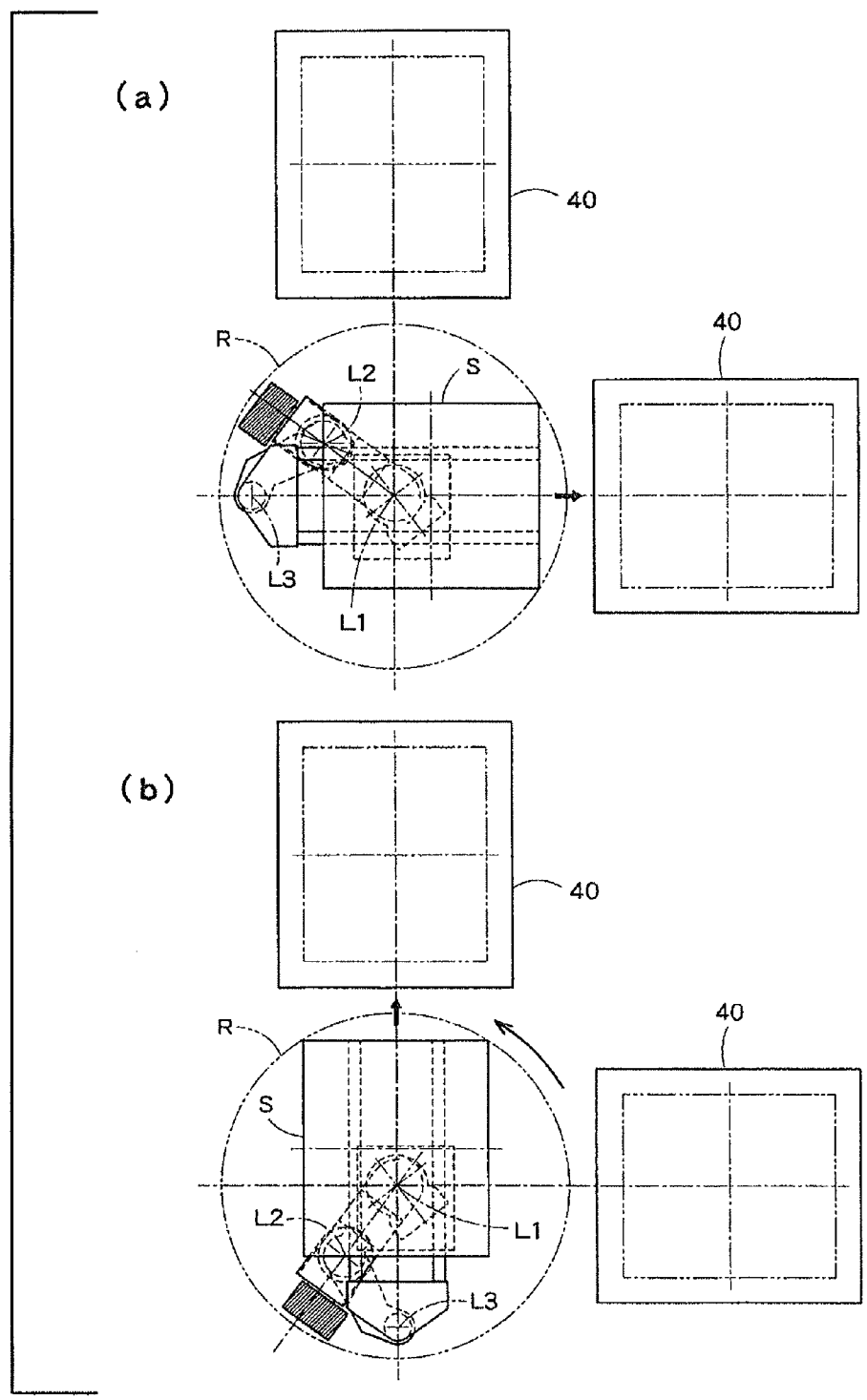
FIG. 12A is a diagram for explaining a rotation movement on its own axis of a robot arm holding a substrate in the conveyance robot illustrated in FIG. 9, (a) illustrates a state where the robot arm faces the direction of one rack, and (b) illustrates a state where the robot arm faces the direction of the other rack.

As can be seen from FIGS. 12(a), (b), and (c), for the backward and forward movement of the substrate holding member 7B, the third axis L3 moves along the common straight line M that passes through the first axis L1. This common straight line M substantially corresponds to the center line of the substrate holding member 7B, and subsequently the center of the substrate S which is held by the substrate holding member 7B moves along the common straight line M.

Note that, when making the robot arm with the substrate S held by the substrate holding member 7B rotate on its own axis, as illustrated in FIGS. 12 A(a) and (b), the first link member 2B is rotated about the first axis L1 in the state illustrated in FIG. 12(a). By doing so, the substrate S can be carried-in and carried-out from a multiple number of racks 40 which are placed at the different positions. Here, since the substrate S is a heavy article, by keeping its center of gravity as close to the first axis L1 as possible, the power needed for rotating the robot arm, which holds the substrate S, on its own axis can be reduced, and at the same time, the rotation exclusive area occupied by the substrate S and the robot arm holding the same while rotating on its own axis can be minimized. Thus, in this embodiment, by retracting the ascending and descending drive unit 4B into a position illustrated in FIG. 12(a), the center of gravity of the substrate S becomes closer to the first axis L1, and further the turning radius of the ascending and descending drive unit 4B can be minimized.

As illustrated in FIG. 12A, in this embodiment, each size of the substrate holding member 7B, the first link member 2B, the second link member 3B, and ascending and descending drive unit 4B, and the direction of the ascending and descending drive unit 4B are selected in such a way that the areas including the substrate holding member 7B holding the substrate S at the most retracted position on the movement control range, the substrate S held by the substrate holding member 7B, the first link member 2B, the second link member 3B, and the ascending and descending drive unit 4B are placed within a turning area R where a radius is rotated fully about the first axis L1 with the definition of the radius taken from the distance from the first axis L1 to the most distant point of substrate S or the substrate holding member 7B.

According to the embodiment with the above mentioned structure, the ascending and descending drive unit 4B is placed between the first link member 2B and the second link member 3B, therefore a part which is driven to ascend and descend by the ascending and descending drive unit 4B is not the robot arm as a whole, but is only the second link member 3B which is attached to the ascending and descending member 6B and the substrate holding member 7B. Therefore, the load applied to the ascending and descending member 6B of the ascending and descending drive unit 4B is reduced, and consequently the drive power needed for the ascending and descending drive unit 4B can also be reduced.

Moreover, in this embodiment, by keeping the center of gravity of the robot arm holding the substrate S as close to the first axis L1 as possible while rotating on its own axis, and by minimizing the turning radius of the ascending and descending drive unit 4, the power needed for rotation on its own axis can be reduced, and further the rotation exclusive area occupied by the substrate S as well as the robot arm holding the same while rotating on its own axis can be minimized.

Moreover, in this embodiment, as a unit for moving the ascending and descending drive unit 4B in the horizontal plane, the first link member 2B which is a part of the robot arm is used, and this enables the ascending and descending drive unit 4B to move horizontally while minimizing the complication of the robot structure.

Moreover, the ascending and descending member 6B is disposed on the side surface of the pillar shaped member 5B of the ascending and descending drive unit 4B, and this enables the ascending and descending member 6B together with the substrate holding member 7B to ascend and descend along the side surface of the pillar shaped member 5B. Therefore, compared to a pantographic type of ascending and descending unit for a conventional conveyance robot, the lowest position of the substrate holding member 7B can be further lowered.

Figure 13:
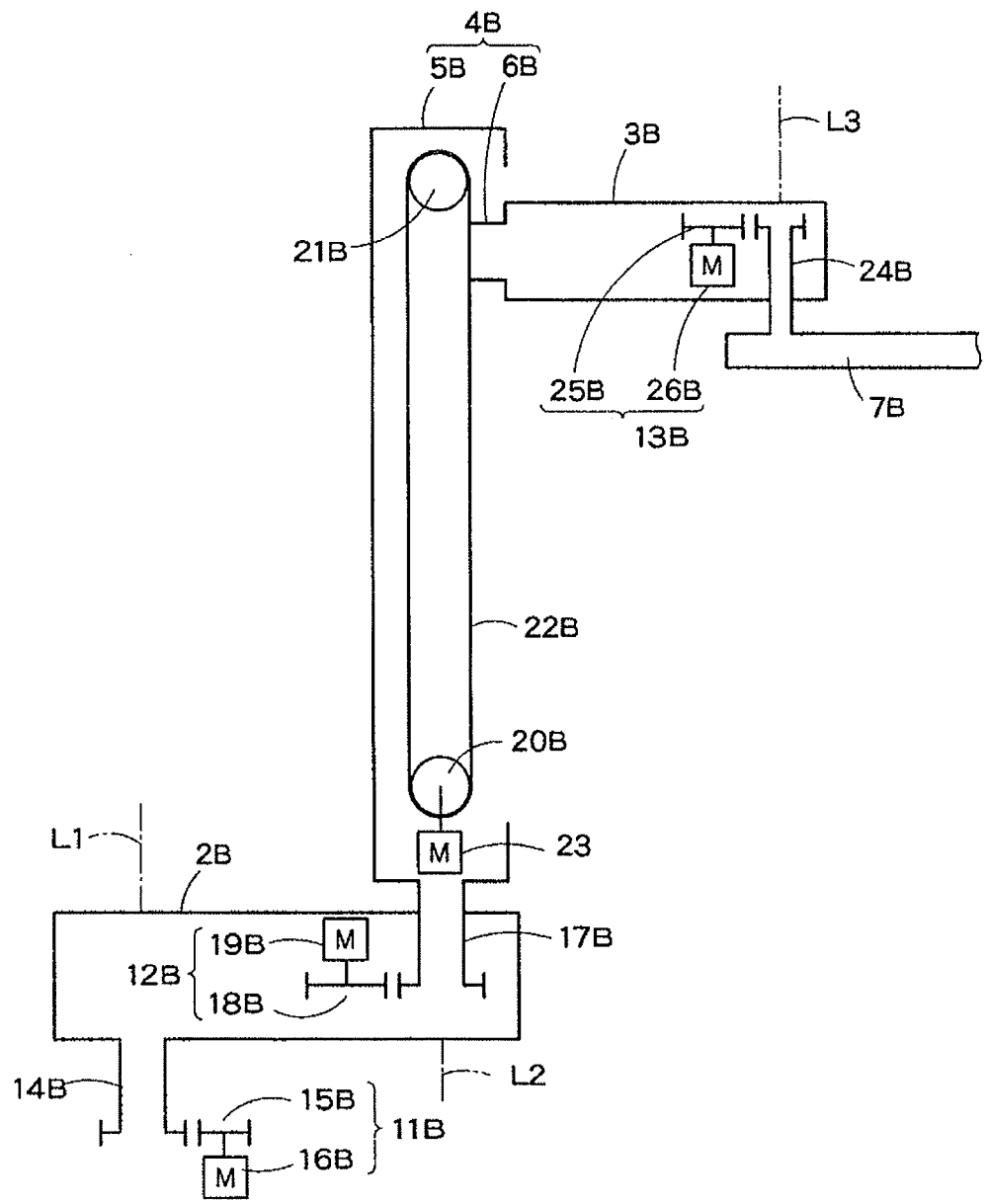
FIG. 13 is a schematic diagram illustrating a conveyance robot according to an alternative example of the embodiment illustrated in FIG. 9.

Next, as a modification for the above mentioned embodiment illustrated in FIG. 9 to FIG. 12, the pillar shaped member 5B of the ascending and descending drive unit 4B can be disposed on the first link member 2B so as to be rotatable about the second axis L2, and further the second link member 3B can be fixed on the ascending and descending member 6B, as illustrated in FIG. 13.

With respect to the modification illustrated in FIG. 13, the second rotation shaft 17B is disposed on the lower end of the pillar shape member 5B, and the second link drive unit 12B that rotates this second rotation shaft 17B is placed inside the first link member 2B.

The preferred embodiments of the present invention are described above, however, the above mentioned embodiments can be modified appropriately within the range of the present invention. For example, in each embodiment mentioned above, each servomotor is disposed on each rotation shaft so as to drive the same separately, but instead, a belt can be wound between rotation shafts so that the rotation power of the one shaft is transmitted to the other, so as to omit the servomotor of the other rotation shaft. Moreover, the drive mechanism in the ascending and descending drive unit can be a linearly moving mechanism including a rack pinion, a linear motor, a cylinder, or the like.

FIG. 2
11 FIRST LINK DRIVE UNIT
12 SECOND LINK DRIVE UNIT
4 ASCENDING AND DESCENDING DRIVE UNIT
13 WRIST SHAFT DRIVE UNIT
10 ROBOT CONTROL UNIT
FIG. 6
11A FIRST LINK DRIVE UNIT
12A SECOND LINK DRIVE UNIT
4A ASCENDING AND DESCENDING DRIVE UNIT
13A WRIST SHAFT DRIVE UNIT
10A ROBOT CONTROL UNIT
FIG. 10
11B FIRST LINK DRIVE UNIT
12B SECOND LINK DRIVE UNIT
4B ASCENDING AND DESCENDING DRIVE UNIT
13B WRIST SHAFT DRIVE UNIT
10B ROBOT CONTROL UNIT

The invention claimed is:

1. A conveyance robot comprising:
    a first link member configured to rotate about a first axis;
    a second link member configured to rotate about a second axis that is positioned at a predetermined distance relative to the first axis;
    a holding member configured (i) to rotate about a third axis that is positioned at a predetermined distance relative to the second axis, and (ii) to hold an article;
    an ascending and descending drive unit that drives at least the holding member to ascend and descend so as to convey the article held by the holding member in a vertical direction, the ascending and descending drive unit including (i) a pillar shaped member, and (ii) an ascending and descending member, the ascending and descending member being disposed perpendicularly to the pillar shaped member and extending from the pillar shaped member, wherein
    an arm link mechanism is constituted by connecting the first link member, the second link member, and the holding member in this order, and the ascending and descending drive unit is placed between the first link member and the holding member so as to form a part of the arm link mechanism; and
    the ascending and descending drive unit is connected at a first end to the first link member and pivotally connected at a second end to the second link member.

2. The conveyance robot according to claim 1, wherein
    the pillar shaped member is fixed on the first link member;
    the ascending and descending member is disposed to the pillar shaped member so as to be able to ascend and descend;
    the second link member is disposed on the ascending and descending member so as to be rotatable about the second axis; and
    the holding member is disposed on the second link member so as to be rotatable about the third axis.

3. The conveyance robot according to claim 1, wherein
    the pillar shaped member is disposed on the first link member so as to be rotatable about the second axis;
    the ascending and descending member is disposed to the pillar shaped member so as to be able to ascend and descend; and
    the second link member is fixed on the ascending and descending member.

4. The conveyance robot according to claim 1, wherein the predetermined distance between the first axis and the second axis is equal to the predetermined distance between the second axis and the third axis.

5. The conveyance robot according to claim 1, wherein
    a size of each of the holding member, the first link member, the second link member, and the ascending and descending drive unit, and a direction of the ascending and descending drive unit are all selected such that, at a most retracted position of the ascending and descending drive unit, the holding member holding an article, the article held by the holding member, the first link member, the second link member, and the ascending and descending drive unit are configured so as to be rotated fully in a radius about the first axis when placed with a turning area, the radius being defined as a distance from the first axis to a most distant point of the article or the holding member.

* * * * *